(12) United States Patent
Jeon et al.

(10) Patent No.: US 9,620,502 B2
(45) Date of Patent: Apr. 11, 2017

(54) SEMICONDUCTOR DEVICE INCLUDING AN EXTENDED IMPURITY REGION

(71) Applicants: Chan-Hee Jeon, Hwaseong-si (KR); Eun-Kyoung Kwon, Suwon-si (KR); Il-Ryong Kim, Hwaseong-si (KR); Han-Gu Kim, Seongnam-si (KR); Woo-Jin Seo, Hwaseong-si (KR); Ki-Tae Lee, Seongnam-si (KR)

(72) Inventors: Chan-Hee Jeon, Hwaseong-si (KR); Eun-Kyoung Kwon, Suwon-si (KR); Il-Ryong Kim, Hwaseong-si (KR); Han-Gu Kim, Seongnam-si (KR); Woo-Jin Seo, Hwaseong-si (KR); Ki-Tae Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 111 days.

(21) Appl. No.: 14/178,480

(22) Filed: Feb. 12, 2014

(65) Prior Publication Data

US 2014/0306296 A1  Oct. 16, 2014

Related U.S. Application Data

(60) Provisional application No. 61/810,348, filed on Apr. 10, 2013.

(30) Foreign Application Priority Data

Jul. 8, 2013 (KR) .......................... 10-2013-0079824

(51) Int. Cl.
*H01L 27/088* (2006.01)
*H01L 29/66* (2006.01)
*H01L 27/11* (2006.01)

(52) U.S. Cl.
CPC ...... *H01L 27/0886* (2013.01); *H01L 27/1104* (2013.01); *H01L 29/66795* (2013.01)

(58) Field of Classification Search
CPC .......... H01L 27/0886; H01L 29/66795; H01L 27/1104
USPC ...................................................... 257/401
See application file for complete search history.

(56) References Cited

U.S. PATENT DOCUMENTS

| | | | |
|---|---|---|---|
| 7,687,859 B2 | 3/2010 | Russ et al. | |
| 7,919,816 B2 | 4/2011 | Gossner et al. | |
| 7,923,266 B2 | 4/2011 | Thijs et al. | |
| 7,964,893 B2 | 6/2011 | Lee | |
| 8,331,068 B2 | 12/2012 | Lee et al. | |
| 8,551,841 B2 | 10/2013 | Lee et al. | |
| 2008/0079094 A1* | 4/2008 | Jin et al. | 257/401 |
| 2008/0277729 A1 | 11/2008 | Gossner et al. | |

(Continued)

*Primary Examiner* — Tranh Y Tran
*Assistant Examiner* — Mohammad M Hoque
(74) *Attorney, Agent, or Firm* — Harness, Dickey & Pierce, P.L.C.

(57) ABSTRACT

In one embodiment, the semiconductor device includes at least one active fin protruding from a substrate, a first gate electrode crossing the active fin, and a first impurity region formed on the active fin at a first side of the first gate electrode. At least a portion of the first impurity region is formed in a first epitaxial layer portion on the active fin. A second impurity region is formed on the active fin at a second side of the first gate electrode. The second impurity region has at least a portion not formed in an epitaxial layer.

23 Claims, 27 Drawing Sheets

(56) References Cited

U.S. PATENT DOCUMENTS

| | | |
|---|---|---|
| 2010/0207161 A1 | 8/2010 | Shrivastava et al. |
| 2013/0175578 A1* | 7/2013 | Lee et al. .................. 257/192 |
| 2014/0092506 A1* | 4/2014 | Ahsan et al. ................ 361/56 |
| 2014/0191297 A1* | 7/2014 | Utomo et al. ............... 257/288 |

* cited by examiner

14

1200

1300

1400

SEMICONDUCTOR DEVICE INCLUDING AN EXTENDED IMPURITY REGION

CROSS-REFERENCE TO RELATED APPLICATION

This application claims priority from U.S. Patent Application No. 61/810,348 filed on Apr. 10, 2013 and Korean Patent Application No. 10-2013-0079824 filed on Jul. 8, 2013 in the Korean Intellectual Property Office, and all the benefits accruing therefrom under 35 U.S.C. 119, the contents of each of which in its entirety are herein incorporated by reference.

BACKGROUND

1. Technical Field

Example embodiments relate to a semiconductor device and/or a method for fabricating the same.

2. Description of the Related Art

Recent semiconductor devices are advancing toward semiconductor devices having a high speed operation characteristic with a low voltage, and fabricating methods of semiconductor devices are advancing to achieve improved integration levels.

The improved integration of a device may cause a short channel effect to a field effect transistor (FET), which is one element of many semiconductor devices. Accordingly, in order to overcome this disadvantage, research into a fin FET having a channel with a three-dimensional space structure is being actively conducted.

SUMMARY

At least one embodiment relates to a semiconductor device.

In one embodiment, the semiconductor device includes at least one active fin protruding from a substrate, a first gate electrode crossing the active fin, and a first impurity region formed on the active fin at a first side of the first gate electrode. At least a portion of the first impurity region is formed in a first epitaxial layer portion on the active fin. A second impurity region is formed on the active fin at a second side of the first gate electrode. The second impurity region has at least a portion not formed in an epitaxial layer.

In one embodiment, an entirety of the second impurity region is not formed in an epitaxial layer.

In one embodiment, the second impurity region has a top surface at a same height as a top surface of a portion of the active fin crossed by the gate electrode.

In one embodiment, the second impurity region has a greater width in the longitudinal direction of the active fin than the first impurity region. In one embodiment, the semiconductor device further includes a first contact electrically connected to the first impurity region; and a second contact electrically connected to a distal end of the second impurity region with respect to the first gate electrode. In one embodiment, a top surface of the first impurity region is higher than the top surface of the portion of the active fin crossed by the gate electrode.

In one embodiment, the semiconductor device further includes a second gate electrode crossing the active fin, and a third impurity region formed on the active fin at a first side of the second gate electrode. Here, the first impurity region is formed on the active fin at a second side of the second gate electrode.

In one embodiment, the semiconductor device further includes a second gate electrode crossing the active fin, and a third impurity region formed on the active fin at a first side of the second gate electrode and the second side of the first gate electrode. Here, the second impurity region is formed on the active fin at a second side of the second gate electrode.

In one embodiment, the semiconductor device further includes the semiconductor device further includes a conductor electrically connecting the second and third impurity regions.

In one embodiment, the second impurity region includes a first portion and second portion. The first portion is formed in a second epitaxial layer portion, and the second portion is not formed in an epitaxial layer. In one embodiment, the second impurity region has a greater width in the longitudinal direction of the active fin than the first impurity region. The first portion may be at a distal end of the second impurity region with respect to the first gate electrode. Here, the semiconductor device may further include a first contact electrically connected to the first impurity region, and a second contact electrically connected to the first portion of the second impurity region. In one embodiment, a top surface of the first portion is higher than the top surface of the active fin crossed by the first gate electrode. In one embodiment, a top surface of the first impurity region is higher than the top surface of the active fin crossed by the first gate electrode. In another embodiment, the top surface of the first impurity region and the top surface of the first portion are a same height. In one embodiment, the second impurity region includes a third portion. The third portion may be at a proximate end of the second impurity region with respect to the first gate electrode, and the third portion may be formed in a third epitaxial layer portion on the active fin. A top surface of the first portion and a top surface of the third portion may be a same height. In one embodiment, a top surface of the first portion may be higher than the top surface of the active fin crossed by the first gate electrode, and a top surface of the third portion may be higher than the top surface of the active fin crossed by the first gate electrode.

In one embodiment, the semiconductor device further includes an etch stop layer formed over the second portion.

In one embodiment, the semiconductor device further includes a second gate electrode crossing the active fin, and a third impurity region formed on the active fin at a first side of the second gate electrode. Here, the first impurity region is formed on the active fin at a second side of the second gate electrode.

In one embodiment, the semiconductor device further includes a second gate electrode crossing the active fin, and a third impurity region formed on the active fin at a first side of the second gate electrode and the second side of the first gate electrode. Here, the second impurity region is formed on the active fin at a second side of the second gate electrode. In one embodiment, the semiconductor device further includes a conductor electrically connecting the second and third impurity regions.

At least one embodiment relates to a method of fabricating a semiconductor device.

In one embodiment, the method includes forming a first gate electrode across an active fin projecting from a substrate. The first gate electrode has a first side and a second side. The method further includes forming an etch stop layer on the active fin at the second side of the first gate electrode, etching the active fin to form a first trench in the active fin at the first side of the first gate electrode, forming an epitaxial layer on the active fin using the first gate electrode and the etch stop layer as masks such that a first epitaxial layer portion fills the first trench, and conducting doping operations to form a first impurity region in a portion of the first epitaxial layer portion and a second impurity region in the active fin at the second side of the first gate electrode.

In one embodiment, the method further includes forming an insulating layer over the substrate, and forming first and second contact holes in the insulating layer. The first contact hole exposes a portion of the first impurity region and the second contact hole exposes a portion of the second impurity region. The method further includes forming first and second contacts in the first and second contact holes, respectively, such that the first contact is electrically connected to the first impurity region and the second contact is electrically connected to the second impurity region.

In one embodiment, the etch stop layer exposes a first portion of the active fin at a second side of the first gate electrode, the etching forms a second trench in the first portion, the forming an epitaxial layer forms a second epitaxial layer portion in the second trench, and the conducting forms part of the second impurity region in the second epitaxial layer portion.

In one embodiment, the second epitaxial layer portion is at a proximal end of the second impurity region with respect to the first gate electrode.

In one embodiment, the second epitaxial layer portion is at a distal end of the second impurity region with respect to the first gate electrode.

In one embodiment, the forming an epitaxial layer forms the first and second epitaxial layer portions such that a top surface of the first epitaxial layer portion and a top surface of the second epitaxial layer portion are both higher than a top surface of the active fin.

In one embodiment, the forming an etch stop layer forms the etch stop layer to cover an entirety of a portion of the active fin at which the second impurity region is to be formed.

In one embodiment, the second impurity region has a greater width in the longitudinal direction of the active fin than the first impurity region.

In one embodiment, the conducting includes conducting a first ion implantation, forming a mask covering the substrate such that etch stop layer is exposed, and conducting a second ion implantation.

In one embodiment, the method further includes removing the etch stop layer.

BRIEF DESCRIPTION OF THE DRAWINGS

The above and other features and advantages of the example embodiments will become more apparent by describing in detail preferred embodiments thereof with reference to the attached drawings in which.

DETAILED DESCRIPTION OF THE EMBODIMENTS

Figure 1:
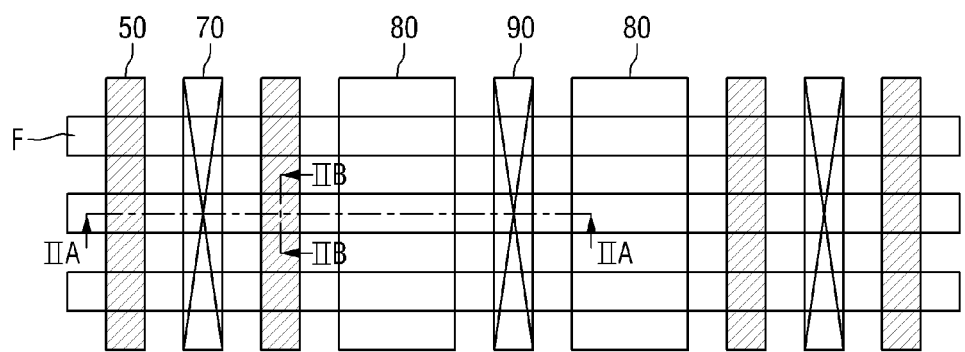
FIG. 1 is a conceptual layout view of a semiconductor device according to a first embodiment.

Advantages and features of the example embodiments may be understood more readily by reference to the following detailed description and the accompanying drawings. The example embodiments may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the example embodiments.

The example embodiments will be described with reference to perspective views, cross-sectional views and/or plan views. Thus, the profile of an example view may be modified according to manufacturing techniques and/or allowances. That is, the embodiments are not intended to limit the scope of the example embodiments but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art. It is noted that the use of any and all examples, or example terms provided herein is intended merely to better illuminate the example embodiments and is not a limitation on the scope of the invention unless otherwise specified. Further, unless defined otherwise, all terms defined in generally used dictionaries may not be overly interpreted.

Hereinafter, a semiconductor device according to a first embodiment will be described with reference to FIGS. 1 to 4B.

Figure 2A:
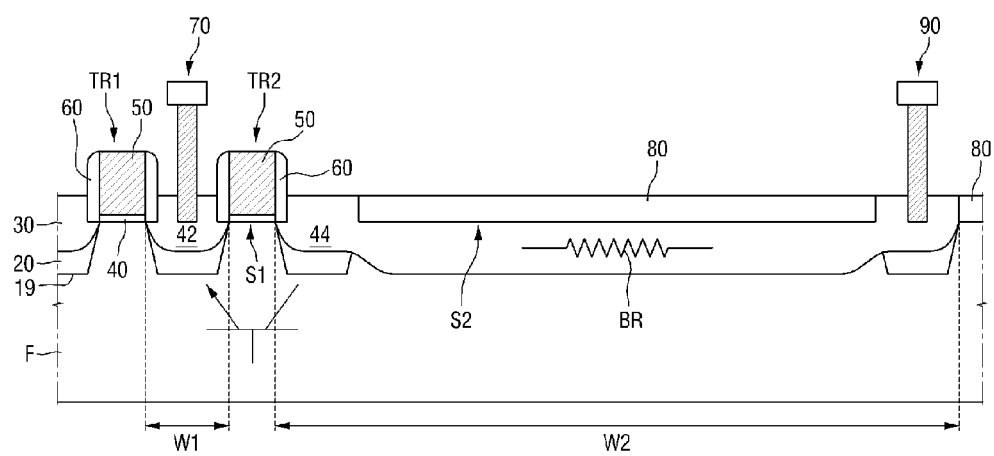
FIG. 2A is a cross-sectional view taken along the line IIA-IIA of FIG. 1
Figure 2B:
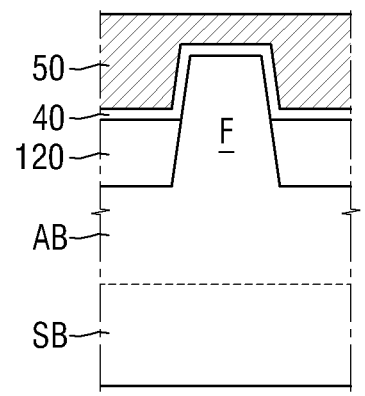
FIG. 2B is a cross-sectional view taken along the line IIB-IIB of FIG. 1.
Figure 3:
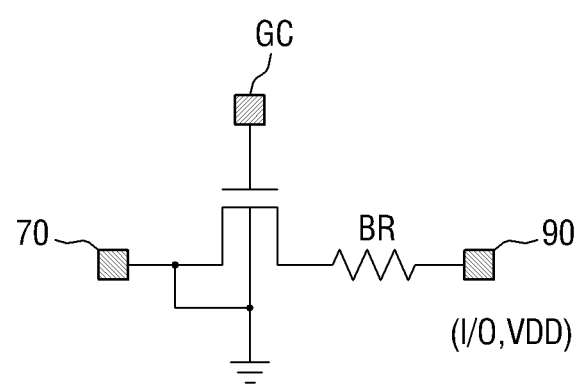
FIG. 3 is a circuit view of the semiconductor device according to the first embodiment.
Figure 4A:
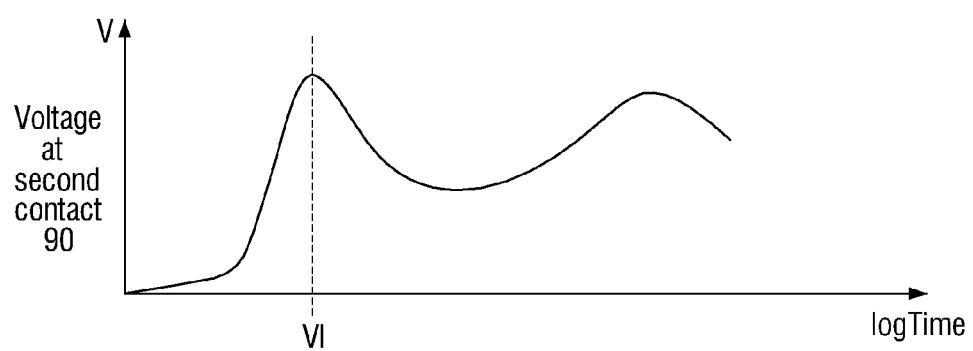
FIGS. 4A-4B are graphs illustrating the operation of the semiconductor device according to the first embodiment.
Figure 4B:
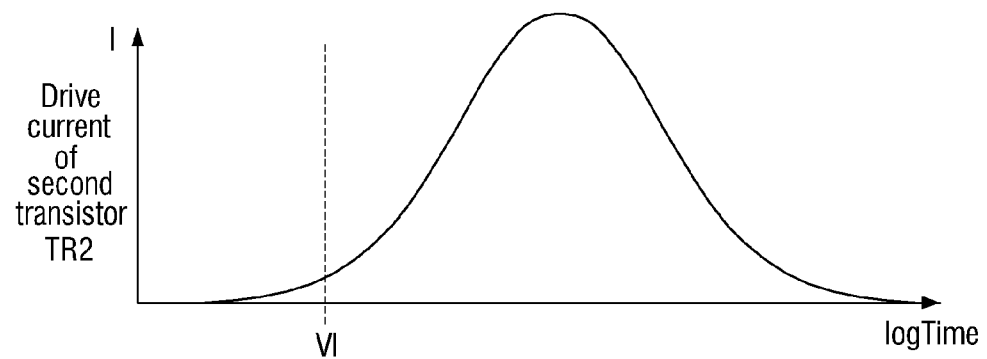

FIG. 1 is a conceptual layout view of a semiconductor device according to a first embodiment, FIG. 2A is a cross-sectional view taken along the line IIA-IIA of FIG. 1 and FIG. 2B is a cross-sectional view taken along the line IIB-IIB of FIG. 1, FIG. 3 is a circuit view of the semiconductor device according to the first embodiment, and FIGS. 4A-4B are graphs illustrating the operation of the semiconductor device according to the first embodiment.

First, referring to FIGS. 1 to 2B, the semiconductor device 1 includes active fins F, gate electrodes 50, a first impurity region 42, and a second impurity region 44.

The active fins F may be formed to protrude from a substrate SB and may extend in a first direction (e.g., in the X-axis direction). Here, the active fins F may be formed by etching a portion of the substrate SB. That is to say, the substrate SB and the active fins F may include the same material, but aspects of the example embodiments are not limited thereto. The active fins F may also be formed by another method. For example, in some embodiments, the active fins F may be formed by allowing an epitaxial layer to separately grow on the substrate SB and etching the grown epitaxial layer.

In some embodiments, as shown in FIG. 2B, active bases AB separated from each other by a deep trench isolation (DTI) (110 of FIG. 19B) are formed on the substrate SB, and the active fins F may be formed on the active bases AB. The active fins F may be separated from each other by a shallow trench isolation (STI) 120, but aspects of the example embodiment are not limited thereto. However, the active bases AB may not be formed. That is to say, in some other example embodiment, the active fins F may be directly formed on the substrate SB.

In some embodiments, as shown, the active fins F may be formed by grouping each two of the active fins F. That is to say, two active fins F may be formed on one of the active bases AB. The active fins F are arranged in such a manner because they are formed by etching the active bases AB using two dummy spacers, but aspects of the example embodiment are not limited thereto. The arrangement of the active fins F may be modified in various manners.

In the illustrated embodiment, sectional shapes of the active fins F are tapered such that widths of the active fins F increase gradually from top portions to bottom portions, but aspects of the example embodiment are not limited thereto. In some embodiments, the active fins F may be modified to have rectangular sections. In addition, in some other embodiments, the sectional shapes of the active fins F may be chamfered. That is to say, corners of the active fins F may be rounded.

The substrate SB may be, for example, a semiconductor substrate. The substrate SB substrate 10 may be made of one or more semiconductor materials such as Si, Ge, SiGe, GaP, GaAs, SiC, SiGeC, InAs and InP. The active bases AB may be, for example, may be made of a semiconductor material.

In some embodiments, the substrate SB and the active bases AB may include the same material.

Meanwhile, in some embodiments, the substrate SB may be an insulating substrate. In detail, the substrate SB may be a silicon on insulator (SOI) substrate. Here, the active fins F and the active bases AB may be formed by forming single crystalline silicon on a buried oxide layer used as the substrate SB and patterning the single crystalline silicon. In this case, the active fins F and the active bases AB may be epitaxial layers. Use of the SOI substrate may advantageously reduce a delay time during the operation of the semiconductor device 1.

The gate electrodes 50 may extend in a second direction (e.g., in the Y-axis direction) crossing the active fins F. A gate insulation layer 40 may be formed under the gate electrodes 50. In other words, the gate insulation layer 40 may be disposed between the active fins F and the gate electrodes 50. The gate insulation layer 40 may extend in the second direction (e.g., in the Y-axis direction), like the gate electrode 50.

The gate insulation layer 40 may include, for example, a high-k material (e.g., k greater than 3.9). In some embodiments, the gate insulation layer 40 may include, for example, $HfO_2$, $Al_2O_3$, $ZrO_2$, or $TaO_2$, but aspects of the example embodiment are not limited thereto.

Although not specifically shown, an interface layer may further be provided between the gate insulation layer 40 and the active fins F to avoid poor interfacing characteristics between the gate insulation layer 40 and the active fins F. The interface layer may include a low-k material layer having a dielectric constant (k) of 9 or less, for example, a silicon oxide layer (k≈4) or a silicon oxynitride layer (k≈4~8 according to the content of oxygen atoms and nitrogen atoms). Alternatively, the interface layer may include silicate, or a combination of the layers exemplified above.

The gate electrodes 50 may include a conductive material. In some example embodiments, the gate electrodes 50 may include a highly conductive metal, but aspects of the example embodiment are not limited thereto. That is to say, in some other embodiments, the gate electrodes 50 may be made of a non-metal such as polysilicon.

A spacer 60 may be disposed on at least one side of the gate electrodes 50. In detail, as shown in FIG. 2A, the spacer 60 may be formed on both sides of the gate electrode 50. The spacer 60 may include at least one of a nitride layer and an oxynitride layer. In FIG. 2A, one side surface of the spacer 60 is curved, but aspects of the example embodiment are not limited thereto. Shapes of the spacer 60 may be modified in various ways. For example, in some embodiments, unlike in the illustrated embodiment, the spacer 60 may be modified to have a letter "I" shape or an letter "L" shape.

A trench 19 may be disposed at, at least one side of the gate electrode 50 for the first transistor TR1. In detail, as shown in FIG. 2A, the trench 19 may be disposed at both sides of the gate electrode 50 for the first transistor TR1. The trench 19 may be formed by etching the active fins F at both sides of the gate electrode 50.

An epitaxial layer 20 may be formed in the trench 19. In detail, the epitaxial layer 20 may be formed to fill the trench 19. In some embodiments, the epitaxial layer 20 may be formed by performing an epitaxial growth process on the trench 19 to sufficiently fill the trench 19. Therefore, a top surface of the epitaxial layer 20 may be formed higher than a top surface of the trench 19. In addition, in some embodiments, the top surface of the epitaxial layer 20 may be formed higher than a bottom surface of the gate electrode 50, as shown in FIG. 2A. Namely, a top surface of the epitaxial layer 20 may be higher than a top surface of the active fin F.

The epitaxial layer 20 may improve operating characteristics of the first and second transistors TR1 and TR2. For example, when the first and second transistors TR1 and TR2 are NMOS transistors, the epitaxial layer 20 may include a material for applying tensile stress to a channel, such as SiC. Meanwhile, for example, when the first and second transistors TR1 and TR2 are PMOS transistors, the epitaxial layer 20 may include a material for applying compressive stress to a channel, such as SiGe.

An impurity region 30 may be formed inside the epitaxial layer 20 or inside the active fins F. In the following description, the impurity region 30 according to the embodiment will be described with regard to the second transistor TR2, but aspects of the p example embodiment are not limited thereto. The example embodiment may also be applied to other types of transistors (e.g., TR1).

A first impurity region 42 may be formed at one side of the gate electrode 50 of the second transistor TR2 and a second impurity region 44 may be formed at the other side of the gate electrode 50. The first and second impurity regions 42 and 44 may be a source region and a drain region of the second transistor TR2. For example, when conductivity types of the first and second impurity regions 42 and 44 are N types, the second transistor TR2 may be an NMOS transistor. Meanwhile, for example, when conductivity types of the first and second impurity regions 42 and 44 are P types, the second transistor TR2 may be a PMOS transistor.

In some embodiments, the first impurity region 42 may be a source region of the second transistor TR2 and the second impurity region 44 may be a drain region of the second transistor TR2, but aspects of the example embodiment are not limited thereto.

In the embodiment, the first impurity region 42 may be a normal impurity region and the second impurity region 44 may be an extended impurity region. In other words, a width W2 of the second impurity region 44 in the first or longitudinal direction (e.g., the X-axis direction) may be greater than a width W1 of the first impurity region 42 in the first or longitudinal direction (e.g., the X-axis direction). When the second impurity region 44 is an extended impurity region, it may perform a ballast resistance (BR) function. In this case, as a bipolar junction transistor (BJT), including the first impurity region 42, the active fins F and the second impurity region 44 operates, and the second transistor TR2 may perform an electrostatic discharge (ESD) function to block an abrupt surge applied to a second contact 90, which will later be described in more detail.

A proximal end portion and a distal end portion of the second impurity region 44 may be formed in the epitaxial layer 20 and the other portion of the second impurity region 44 may be formed in the active fins F, as shown. Here, a top surface S2 of the second impurity region 44 formed in the active fins F may be formed at substantially the same height as a top surface S1 of the active fins F having the gate electrodes 50 disposed thereon. In such a way, the top surface S2 of the second impurity region 44 formed in the active fins F is formed at substantially the same height with the top surface S1 of the active fins F having the gate electrode 50 disposed thereon because the trench 19 and the epitaxial layer 20 are not formed at corresponding regions by an etch stop layer 80, which will later be described in detail.

Meanwhile, as shown, a top surface of the second impurity region 44 formed in the epitaxial layer 20 may be formed higher than the top surface S2 of the second impurity region 44 formed in the active fins F. In addition, as shown, the top surface of the second impurity region 44 formed in the epitaxial layer 20 may be formed at substantially the same height with a top surface of the first impurity region 42 formed in the epitaxial layer 20. That is to say, in the embodiment, the first impurity region 42 and the second impurity region 44 may be extended impurity regions formed higher than the bottom surface of the gate electrode 50.

In some embodiments, the first and second impurity regions 42 and 44 may be formed to overlap with the spacer 60. In detail, as shown, portions of the first and second impurity regions 42 and 44 may be tucked under a lower portion of the spacer 60, but aspects of the example embodiment are not limited thereto. The first and second impurity regions 42 and 44 may be modified to have various shapes.

The etch stop layer 80 may be formed on the top surface S2 of the second impurity region 44 formed in the active fins F. In some embodiments, the etch stop layer 80 may include the same material as the spacer 60. That is to say, when the spacer 60 is formed of, for example, a nitride layer, the etch stop layer 80 may also be formed of a nitride layer. In addition, when the spacer 60 is formed of, for example, an oxynitride layer, the etch stop layer 80 may also be formed of an oxynitride layer. In such a way, the etch stop layer 80 and the spacer 60 include the same material because they are simultaneously formed, but aspects of the example embodiment are not limited thereto. Alternatively, the etch stop layer 80 may be formed in various ways.

In detail, in some other embodiments, although not specifically shown, the etch stop layer 80 may be simultaneously formed with a capping layer formed on the gate electrodes 50. In addition, in some other embodiments, the etch stop layer 80 may also be simultaneously formed with a passive device (e.g., a resistor, a capacitor, etc.), rather than an active device, such as the illustrated transistors TR1 and TR2.

The first contact 70 may be electrically connected to the first impurity region 42. The second contact 90 may be electrically connected to the second impurity region 44. For example, the second contract 90 may be electrically connected to the distal end portion of the second impurity region 44. In some embodiments, the first contact 70 may be, for example, a source contact of the second transistor TR2 and the second contact 90 may be, for example, a drain contact of the second transistor TR2, but aspects of the example embodiment are not limited thereto.

As shown, the second impurity region 44 electrically connected to the second contact 90 may be formed in the epitaxial layer 20. In detail, the second impurity region 44 electrically connected to the second contact 90 may be formed in the epitaxial layer 20 filling the trench 19 at the distal end portion of the second impurity region 44, but aspects of the example embodiment are not limited thereto. The shape of a region where the second contact 90 is formed may be modified in various ways.

Meanwhile, the etch stop layer 80 may also be formed at the other side of the second impurity region 44 electrically connected to the second contact 90. The second contact 90 may allow trench 19 and the epitaxial layer 20 to be locally formed only at regions where the etch stop layer 80 is not formed, together with the etch stop layer 80 formed on the top surface S2 of the second impurity region 44 formed in the active fins F.

In the embodiment, when the second transistor TR2 operates, the first contact 70 and the active fins F may be connected to a ground voltage GND, as shown in FIG. 3. An I/O signal or a power supply voltage VDD may be applied to the second contact 90. A desired gate voltage may be applied to the gate electrode 50 through a gate contact GC.

As described above, in the second transistor TR2, the extended second impurity region 44 may serve as a ballast resistance BR. In addition, since the first impurity region 42, the active fins F, and the second impurity region 44 constitute a bipolar junction transistor (BJT), as shown in FIGS. 4A-4B, in the second transistor TR2, even if the voltage applied to the second contact 90 sharply increases as shown in FIG. 4A (e.g., to a large voltage V1), drive current may not sharply increase as shown in FIG. 4B. In other words, an electrostatic discharge (ESD) function may be performed to block an abrupt surge applied to the second contact 90. Therefore, in the second transistor TR2, the extended second impurity region 44 may perform an important function when the second transistor TR2 performs the ESD operation.

In order to form the extended second impurity region 44, the trench 19 is first formed throughout the extended second impurity region 44. When the epitaxial layer 20 is formed in the trench 19 by the epitaxial growth process, since the width W2 of the extended second impurity region 44 is relatively large, the epitaxial layer 20 may not be evenly formed. In such a case, the impurity region 30 formed in the epitaxial layer 20 may not be evenly formed either. In such a manner, if the impurity region 30 is not evenly formed, the second contact 90 may not be electrically connected to the impurity region 30 to then be opened.

Therefore, in the semiconductor device 1 according to the embodiment, the trench 19 and the epitaxial layer 20 are not formed entirely throughout the extended second impurity region 44 but are locally formed only at regions where the epitaxial layer 20 is formed (e.g., regions adjacent to channels of the transistors TR1 and TR2) using the etch stop layer 80. Accordingly, it is possible to avoid a case where the impurity region 30 may not be evenly formed, thereby electrically connecting the second contact 90 to an impurity region (e.g., second impurity region 44) in a reliable manner. Therefore, the reliability of the semiconductor device 1 can be improved.

Next, a semiconductor device according to a second embodiment will be described with reference to FIGS. 5 and 6.

Figure 5:
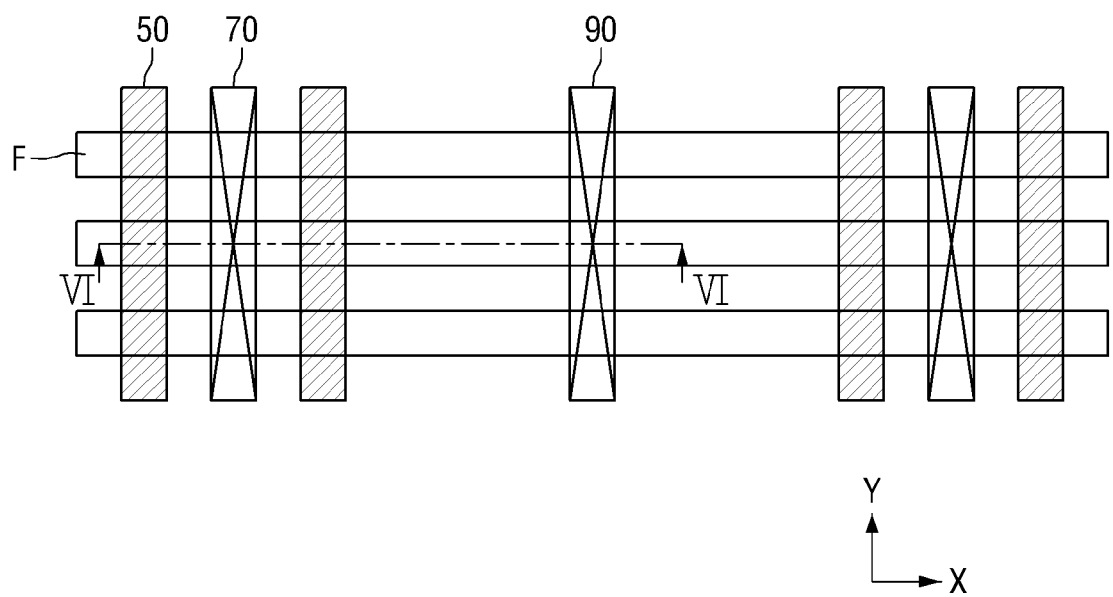
FIG. 5 is a conceptual layout view of a semiconductor device according to a second embodiment.
Figure 6:
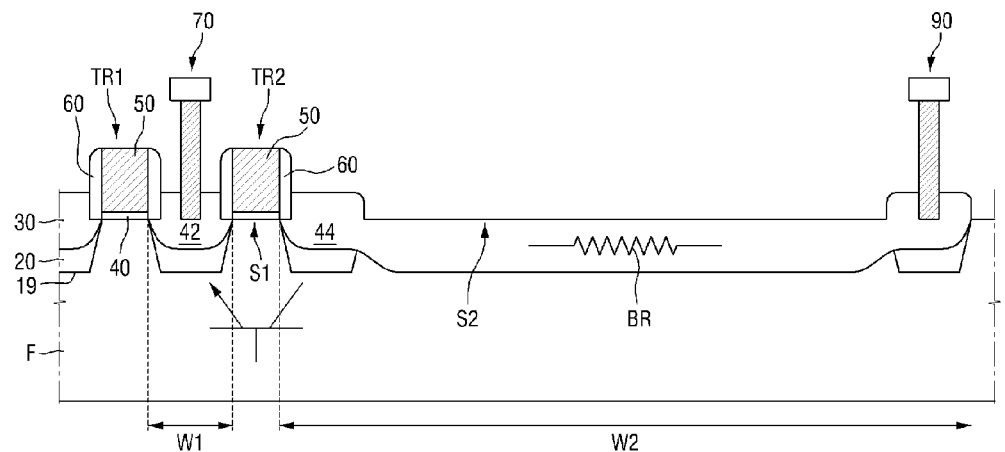
FIG. 6 is a cross-sectional view taken along the line VI-VI of FIG. 5.

FIG. 5 is a conceptual layout view of a semiconductor device according to a second embodiment and FIG. 6 is a cross-sectional view taken along the line VI-V1 of FIG. 5. The following description will focus only on the differences between this embodiment and the previous embodiment.

Referring to FIGS. 5 and 6, the semiconductor device 2 according to the second embodiment is different from the semiconductor device (1 of FIG. 2A) according to the first embodiment in that the etch stop layer (80 of FIG. 2A) formed on the extended second impurity region 44 is removed during the fabrication process to form the semiconductor device 2.

That is to say, in the semiconductor device 2, the etch stop layer (80 of FIG. 2A) is no longer on the top surface S2 of the second impurity region 44 formed in the active fins F. In this case, the top surface S2 of the second impurity region 44 formed in the active fins F may be substantially the same height as the top surface S1 of the active fins F having the gate electrode 50 disposed thereon.

Here, since the second contact 90 and the extended second impurity region 44 are electrically connected in a reliable manner, the reliability of the semiconductor device 2 can be improved.

Next, a semiconductor device according to a third embodiment will be described with reference to FIGS. 7 to 9.

Figure 7:
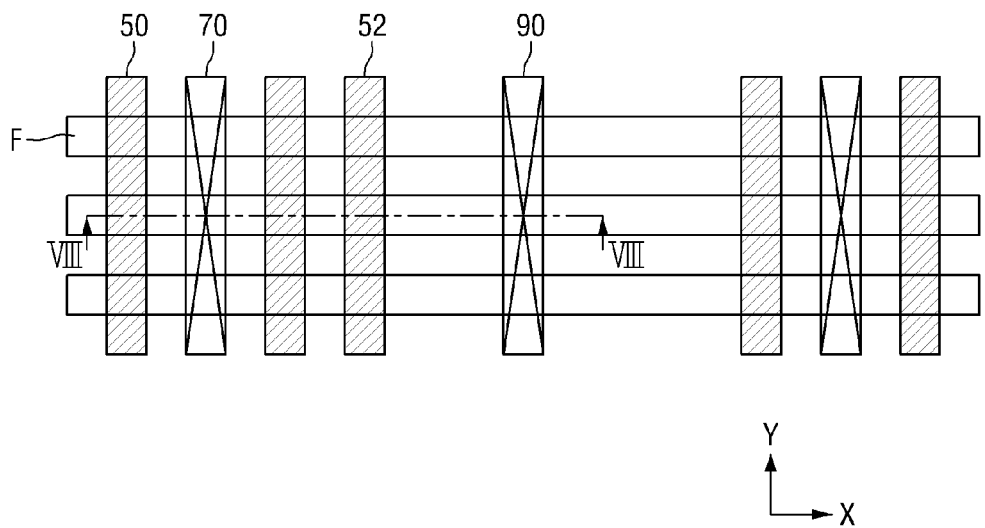
FIG. 7 is a conceptual layout view of a semiconductor device according to a third embodiment.
Figure 8:
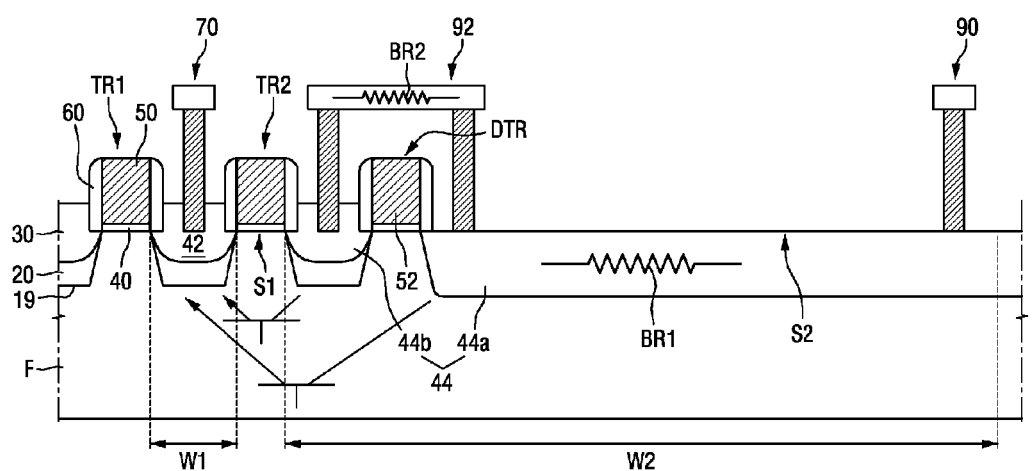
FIG. 8 is a cross-sectional view taken along the line VIII-VIII of FIG. 7.
Figure 9:
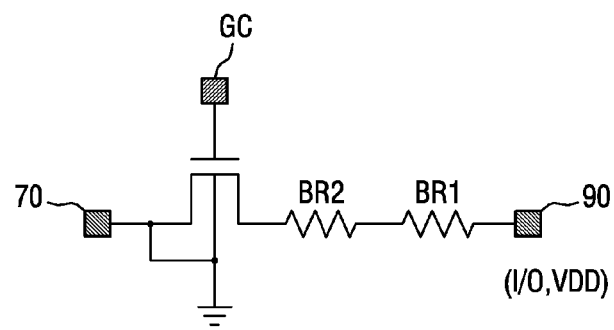
FIG. 9 is a circuit view of the semiconductor device according to the third embodiment.

FIG. 7 is a conceptual layout view of a semiconductor device according to a third embodiment, FIG. 8 is a cross-sectional view taken along the line VIII-VIII of FIG. 7 and FIG. 9 is a circuit view of the semiconductor device according to the third embodiment. For the sake of brevity, the following description will focus on differences between the present embodiment and the previous embodiments.

First, referring to FIGS. 7 and 8, the semiconductor device 3 according to the present embodiment may further include a dummy gate electrode 52 extending in a second direction (e.g., in a Y-axis direction) parallel to the gate electrodes 50. The dummy gate electrode 52 may form a dummy transistor DTR.

Here, an extended second impurity region 44 may include a first sub impurity region 44a disposed at one side of the dummy gate electrode 52 and a second sub impurity region 44b disposed at the other side of the dummy gate electrode 52 and separated from the first sub impurity region 44a.

Meanwhile, the first sub impurity region 44a and the second sub impurity region 44b separated from each other may be electrically connected to each other through a connecting wire 92.

In some embodiments, a width of the first sub impurity region 44a and a width of the second sub impurity region 44b may be different from each other. In detail, as shown, the width of the first sub impurity region 44a may be greater than the width of the second sub impurity region 44b in the longitudinal direction.

Meanwhile, in some embodiments, as shown, the first sub impurity region 44a is formed in active fins F, and the second sub impurity region 44b may be formed in an epitaxial layer 20 filling a trench 19. Therefore, a top surface of the second sub impurity region 44b may be higher than a top surface of the first sub impurity region 44a. Meanwhile, a top surface S2 of the first sub impurity region 44a may be formed at substantially the same height with a top surface S1 of the active fins F having gate electrodes 50 disposed thereon. In addition, the top surface S2 of the first sub impurity region 44a may also be formed at substantially the same height with a top surface of active fins F having the dummy gate electrode 52.

In the illustrated embodiment, the first sub impurity region 44a having a second contact 90 is formed in the active fins F. Therefore, as described above, there is no risk of the first sub impurity region 44a and the second contact 90 being opened due to non-uniform growth of an epitaxial layer 20, thereby improving the reliability of the semiconductor device 3.

Meanwhile, in the embodiment, when the second transistor TR2 operates, the first contact 70 and the active fins F may be connected to a ground voltage GND, as shown in FIG. 9. An I/O signal or a power supply voltage VDD may be applied to the second contact 90. A desired (or, alternatively a predetermined) gate voltage may be applied to the gate electrode 50 through a gate contact GC.

In some embodiments, when the second transistor TR2 operates, the dummy gate electrode 52 may float, but aspects of the example embodiment are not limited thereto. The dummy gate electrode 52 may operate in variousways. For example, in some other embodiments, when the second transistor TR2 operates, a power supply voltage VDD may be applied to the dummy gate electrode 52.

In the semiconductor device 3 according to the embodiment, the first sub impurity region 44a and a connecting wire 92 electrically connecting the first sub impurity region 44a to the second sub impurity region 44b may serve as ballast resistances BR1 and BR2. That is to say, the first sub impurity region 44a may form first ballast resistance BR1 and the connecting wire 92 electrically connecting the first sub impurity region 44a to the second sub impurity region 44b may form second ballast resistance BR2. Therefore, compared to the previous embodiments, the ballast resistances BR1 and BR2 may increase the amount of ballast resistance.

Meanwhile, the first impurity region 42, the active fins F, and the second sub impurity region 44b may constitute a bipolar junction transistor (BJT), and the second sub impurity region 44b, the active fins F, and the first sub impurity region 44a may constitute another bipolar junction transistor (BJT).

Therefore, the second transistor TR2 included in the semiconductor device 3 may improve the ESD function.

Next, a semiconductor device according to a fourth embodiment will be described with reference to FIGS. 10 and 11.

Figure 10:
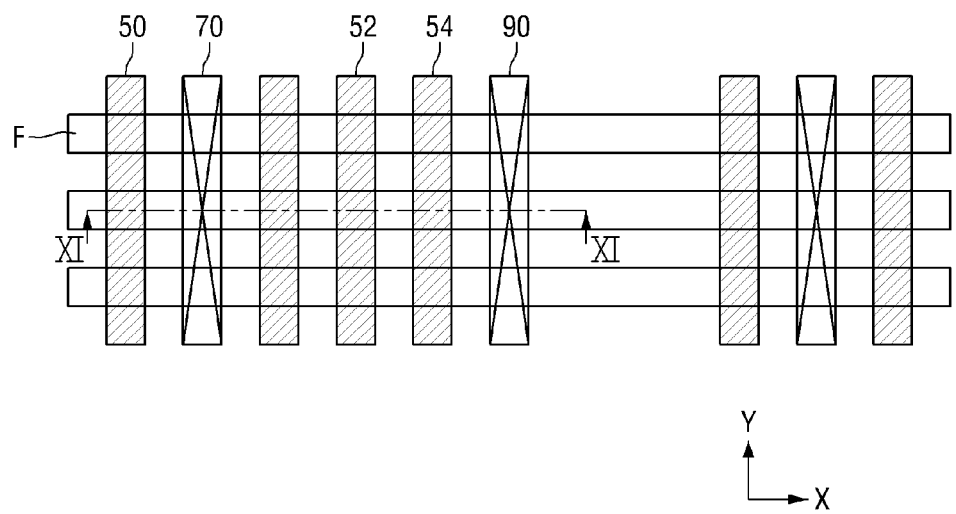
FIG. 10 is a conceptual layout view of a semiconductor device according to a fourth embodiment.
Figure 11:
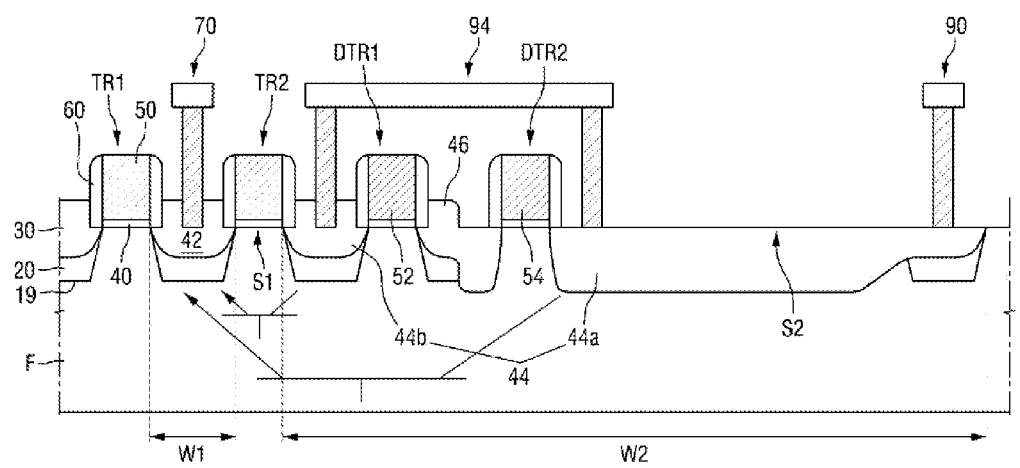
FIG. 11 is a cross-sectional view taken along the line XI-XI of FIG. 10.

FIG. 10 is a conceptual layout view of a semiconductor device according to a fourth embodiment and FIG. 11 is a cross-sectional view taken along the line XI-XI of FIG. 10. For the sake of brevity, the following description will focus on differences between the present embodiment and the previous embodiments.

Referring to FIGS. 10 and 11, the semiconductor device 4 according to the present embodiment may further include first and second dummy gate electrodes 52 and 54 extending in a second direction (e.g., in a Y-axis direction) parallel to the gates electrodes 50. The first dummy gate electrode 52 may form a first dummy transistor DTR1 and the second dummy gate electrode 54 may form a second dummy transistor DTR2.

Here, an extended second impurity region 44 may include a first sub impurity region 44a disposed at one side of the second dummy gate electrode 54 and a second sub impurity region 44b disposed at the other side of the first dummy gate electrode 52 and separated from the first sub impurity region 44a. Meanwhile, a dummy impurity region 46 may be disposed between the first dummy gate electrode 52 and the second dummy gate electrode 54.

As described above, the first sub impurity region 44a included in the second impurity region 44 may be disposed at one side of the second dummy gate electrode 54, the dummy impurity region 46 may be disposed between the first dummy gate electrode 52 and the second dummy gate electrode 54, the second sub impurity region 44b included in the extended second impurity region 44 may be disposed between the gate electrode 50 and the first dummy gate electrode 52, and the first impurity region 42 may be disposed at the other side of the gate electrode 50.

Meanwhile, the first sub impurity region 44a and the second sub impurity region 44b separated from each other may be electrically connected to each other through a connecting wire 94.

In some embodiments, a width of the first sub impurity region 44a and a width of the second sub impurity region 44b may be different from each other. In detail, as shown, the width of the first sub impurity region 44a may be greater than the width of the second sub impurity region 44b in a longitudinal direction.

Meanwhile, in some embodiments, as shown, the first sub impurity region 44a is formed in active fins F, and the second sub impurity region 44b may be formed in an epitaxial layer 20 filling a trench 19. Therefore, a top surface of the second sub impurity region 44b may be higher than a top surface of the first sub impurity region 44a. Meanwhile, a top surface S2 of the first sub impurity region 44a may be formed at substantially the same height as a top surface S1 of the active fins F having gate electrodes 50 disposed thereon. In addition, the top surface S2 of the first sub impurity region 44a may also be formed at substantially the same height with a top surface of active fins F having the dummy gate electrode 52.

In the illustrated embodiment, the first sub impurity region 44a having a second contact 90 is formed in the active fins F. Therefore, as described above, there is no risk of the first sub impurity region 44a and the second contact 90 being opened due to non-uniform growth of an epitaxial layer 20, thereby improving the reliability of the semiconductor device 4.

Meanwhile, as shown, a portion of the dummy impurity region 46 may be formed in the epitaxial layer 20 and the other portion of the dummy impurity region 46 may be formed in the active fins F. That is to say, as shown, a portion of a top surface of the dummy impurity region 46 may be higher than the other portion of the top surface of the dummy impurity region 46. In the embodiment, the dummy impurity region 46 has the shape illustrated herein because an end of an etch stop layer (80 of FIG. 36) is disposed between the first and second dummy gate electrodes 52 and 54 in the fabricating process of the semiconductor device 4, which will later be described in more detail.

Next, a semiconductor device according to a fifth embodiment will be described with reference to FIG. 12.

Figure 12:
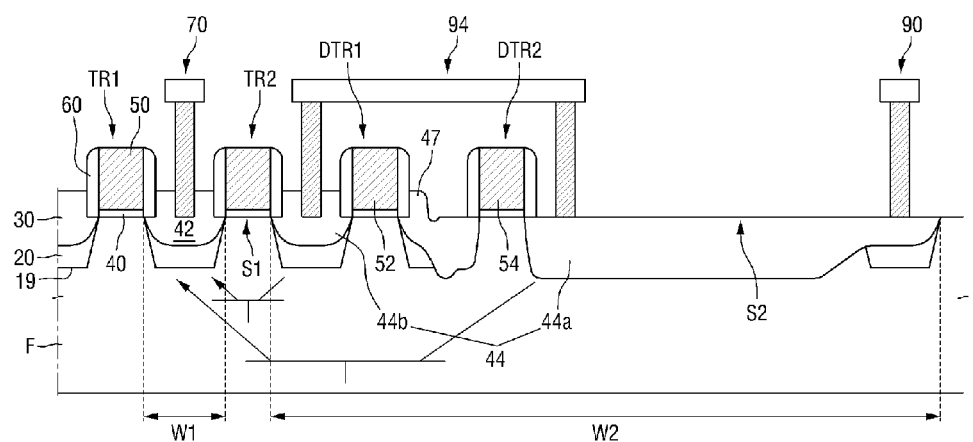
FIG. 12 is a cross-sectional view of a semiconductor device according to a fifth embodiment.

FIG. 12 is a cross-sectional view of a semiconductor device according to a fifth embodiment. The following description will focus on differences between the present embodiment and the previous embodiments.

Referring to FIG. 12, in the semiconductor device 5 according to the present embodiment, a dummy impurity region 47 may have a different shape from the dummy impurity region (46 of FIG. 11) of the semiconductor device 4. In detail, the dummy impurity region 47 formed in an epitaxial layer 20 may have a profile such that a portion of the dummy impurity region 47 is over etched. The dummy impurity region 47 according to the present embodiment has such a profile because a trench 19 and the epitaxial layer 20 are formed in a state in which an end of an etch stop layer (80 of FIG. 36) is disposed between the first and second dummy gate electrodes 52 and 54, but the end of the etch stop layer 80 is damaged due to misalignment of a mask when the etch stop layer 80 is removed, which will later be described in more detail.

Next, a semiconductor device according to a sixth embodiment will be described with reference to FIG. 13.

Figure 13:
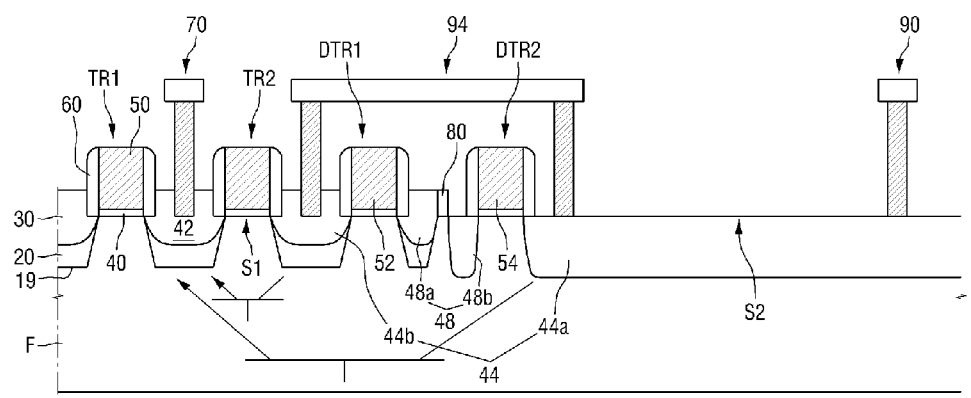
FIG. 13 is a cross-sectional view of a semiconductor device according to a sixth embodiment.

FIG. 13 is a cross-sectional view of a semiconductor device according to a sixth embodiment. The following description will focus on differences between the present embodiment and the previous embodiments.

Referring to FIG. 13, in the semiconductor device 6 according to the present embodiment, a dummy impurity region 48 may include a first dummy impurity region 48a and a second dummy impurity region 48b separated from each other. Here, as shown, the first dummy impurity region 48a may be formed in an epitaxial layer 20 and the second dummy impurity region 48b may be formed in active fins F.

Meanwhile, as shown, an etch stop layer 80 may be disposed between the first dummy impurity region 48a and the second dummy impurity region 48b. Specifically, the etch stop layer 80 may be disposed in the vicinity of the first dummy impurity region 48a formed in the epitaxial layer 20.

The dummy impurity region 48 according to the present embodiment has the shape illustrated herein because a trench 19 and the epitaxial layer 20 are formed in a state in which an end of an etch stop layer (80 of FIG. 36) is disposed between the first and second dummy gate electrodes 52 and 54, but the end of the etch stop layer 80 may remain without being removed due to misalignment of a mask when the etch stop layer 80 is removed, which will later be described in more detail.

Next, a semiconductor device according to a seventh embodiment will be described with reference to FIG. 14.

Figure 14:
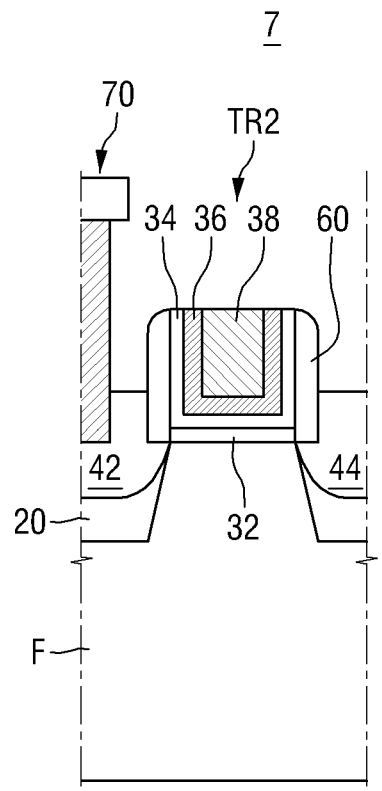
FIG. 14 is a cross-sectional view of a semiconductor device according to a seventh embodiment.

FIG. 14 is a cross-sectional view of a semiconductor device according to a seventh embodiment. The following description will focus on differences between the present embodiment and the previous embodiments.

Referring to FIG. 14, in the semiconductor device 7 according to the present embodiment, a transistor TR2 may be formed by, for example, a replacement process (or a gate last process). Accordingly, as shown, a gate insulation layer 34 may be disposed to upwardly extend along sidewalls of a spacer 60.

Meanwhile, in the embodiment, an interface layer 32 may be formed between the gate insulation layer 34 and active fins F. The interface layer 32 may be formed by, for example, thermal oxidation. The interface layer 32 may include a low-k material layer having a dielectric constant (k) of 9 or less, for example, a silicon oxide layer (k≈4) or a silicon oxynitride layer (k≈4~8 according to the content of oxygen atoms and nitrogen atoms). Alternatively, the interface layer 32 may include silicate, or a combination of the layers exemplified above.

In the semiconductor device 7 according to the present embodiment, a gate electrode may include a work function metal 36 and a gate metal 38. As described above, when the semiconductor device 7 according to the present embodiment is formed by a replacement process (or a gate last process), as shown, the work function metal 36 may be disposed to upwardly extend along sidewalls of a spacer 60.

The work function metal 36 controls a work function and the gate metal 38 may fill a space formed by the work function metal 36. The work function metal 36 may be formed of a single layer made of a metal or may have a multi-layered structure including a metal nitride layer and a metal. Examples of the metal forming the work function metal 36 may include, for example, Al, W, Ti or combinations thereof, and the metal nitride layer may include TiN, TaN or a combination thereof, but aspects of the example embodiments are not limited thereto. The gate metal 38 may include a metal having high conductivity. Examples of the metal may include W or Al, but aspects of the example embodiments are not limited thereto.

Next, a semiconductor device according to an eighth embodiment will be described with reference to FIGS. 15 to 17.

Figure 15:
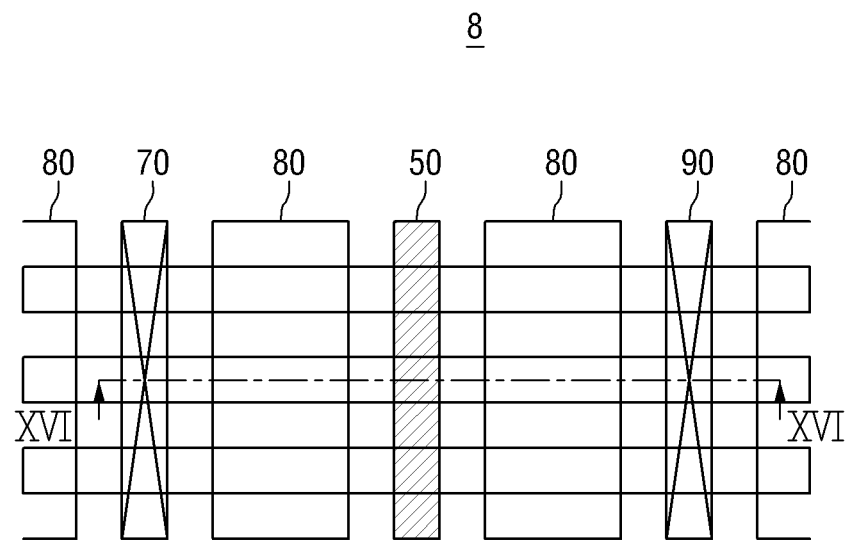
FIG. 15 is a conceptual layout view of a semiconductor device according to an eighth embodiment.
Figure 16:
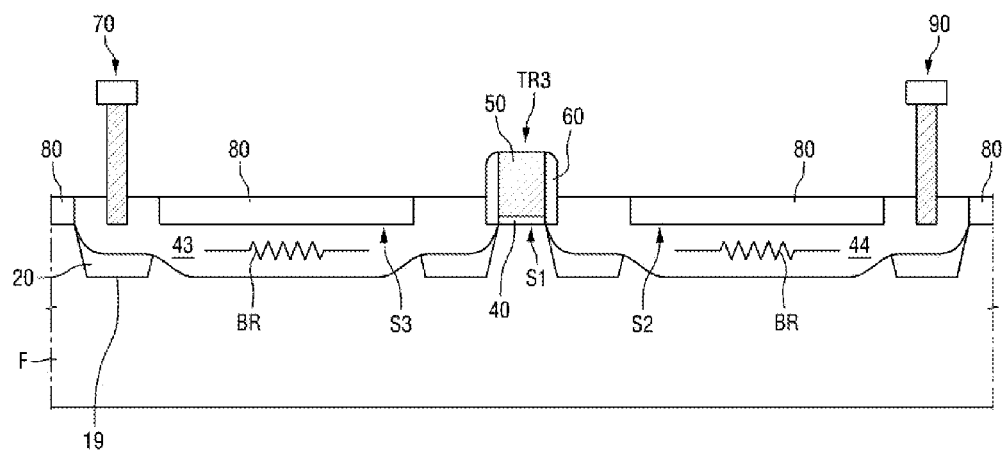
FIG. 16 is a cross-sectional view taken along the line XVI-XVI of FIG. 15.
Figure 17:
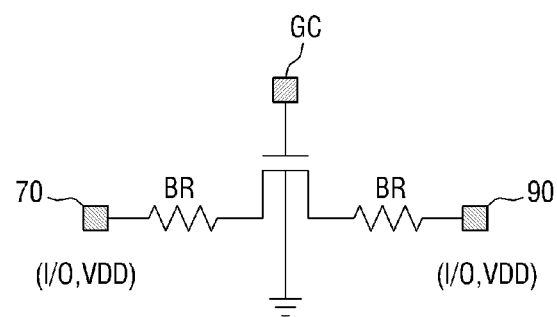
FIG. 17 is a circuit view of the semiconductor device according to the eighth embodiment.

FIG. 15 is a conceptual layout view of a semiconductor device according to an eighth embodiment, FIG. 16 is a cross-sectional view taken along the line XVI-XVI of FIG. 15 and FIG. 17 is a circuit view of the semiconductor device according to the eighth embodiment. The following description will focus on differences between the present embodiment and the previous embodiments.

Referring first to FIGS. 15 and 16, in the semiconductor device 8 according to the present embodiment, a first impurity region 43 and a second impurity region 44 are both extended impurity regions (e.g., extend in a longitudinal directions of the fin F). That is to say, as shown, the first impurity region 43 may be formed throughout an epitaxial layer 20 and active fins F, and the second impurity region 44 may also be formed throughout the epitaxial layer 20 and the active fins F. Accordingly, a width in the first or longitudinal direction (e.g., the X-axis direction) of the first impurity region 43 and a width in the first direction (e.g., the X-axis direction) of the second impurity region 44 may be substantially the same with each other. In addition, a top surface S2 of the second impurity region 44 formed in the active fins F and a top surface S3 of the first impurity region 43 formed in the active fins F may be formed at substantially the same height with a top surface S1 of the active fins F having a gate electrode 50 disposed thereon.

Here, as shown, an etch stop layer 80 may be formed on each of first and second impurity regions 43 and 44. Of course, like in semiconductor device (2 of FIG. 6) of the previous embodiment, the etch stop layer 80 may be removed later during the fabrication process.

In some embodiments, the first impurity region 43 may be a source region of a third transistor TR3 and the second impurity region 44 may be a drain region of the third transistor TR3. In the embodiment, when the third transistor TR3 operates, as shown in FIG. 17, active fins F may be connected to a ground voltage GND. An I/O signal or a power supply voltage VDD may be applied to the first and second contacts 70 and 90. That is to say, in some embodiments, the I/O signal may be applied to the first contact 70 and the power supply voltage VDD may be applied to the second contact 90. In addition, in some other embodiments, the power supply voltage VDD may be applied to the first contact 70 and the I/O signal may be applied to the second contact 90. In addition, in some other embodiments, the power supply voltage VDD may be applied to both of the first contact 70 and the second contact 90, or the I/O signal may be applied to both of the first contact 70 and the second contact 90.

Both of the extended first impurity region 43 and the extended second impurity region 44 may serve as ballast resistance BR. Therefore, in the present embodiment, the ballast resistance BR may exist in a path connected to the first contact 70 and may also exist in a path connected to the second contact 90. A desired (or, alternatively a predetermined) gate voltage may be applied to the gate electrode 50 through a gate contact GC.

Next, a semiconductor device according to a ninth embodiment will be described with reference to FIG. 18.

Figure 18:
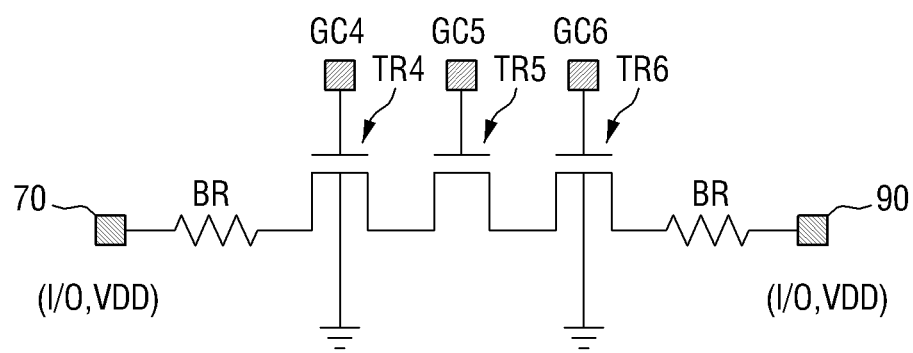
FIG. 18 is a circuit view of a semiconductor device according to a ninth embodiment.

FIG. 18 is a circuit view of a semiconductor device according to a ninth embodiment. The following description will focus on differences between the present embodiment and the previous embodiments.

Referring to FIG. 18, the semiconductor device 9 according to the present embodiment may include stack transistors. In FIG. 18, fourth to sixth transistors TR4 to TR6 are stacked in series, but aspects of the example embodiments are not limited thereto. That is to say, in some other embodiments, the number of stack transistors may vary.

Transistors included in the semiconductor devices 1 to 8 according to the above-described embodiments may be employed to one of the fourth to sixth transistors TR4 to TR6. For example, the transistors included in the semiconductor device 1 may be employed as the fourth transistor TR4 and the sixth transistor TR6.

Next, a semiconductor device according to a tenth embodiment will be described with reference to FIGS. 19A and 19B.

Figure 19A:
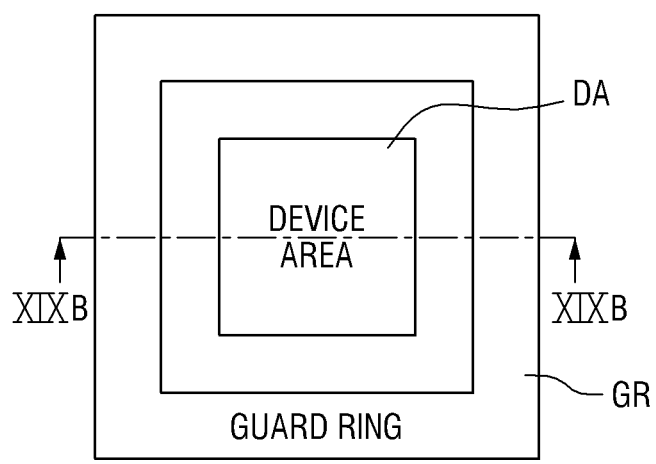
FIG. 19A is a conceptual layout view of a semiconductor device according to a tenth embodiment and FIG. 19B is a cross-sectional view taken along the line XIXB-XIXB of FIG. 19A.

FIG. 19A is a conceptual layout view of a semiconductor device according to a tenth embodiment and FIG. 19 is a cross-sectional view taken along the line XIXB-XIXB of FIG. 19A. The following description will focus on differences between the present embodiment and the previous embodiments.

Figure 19B:
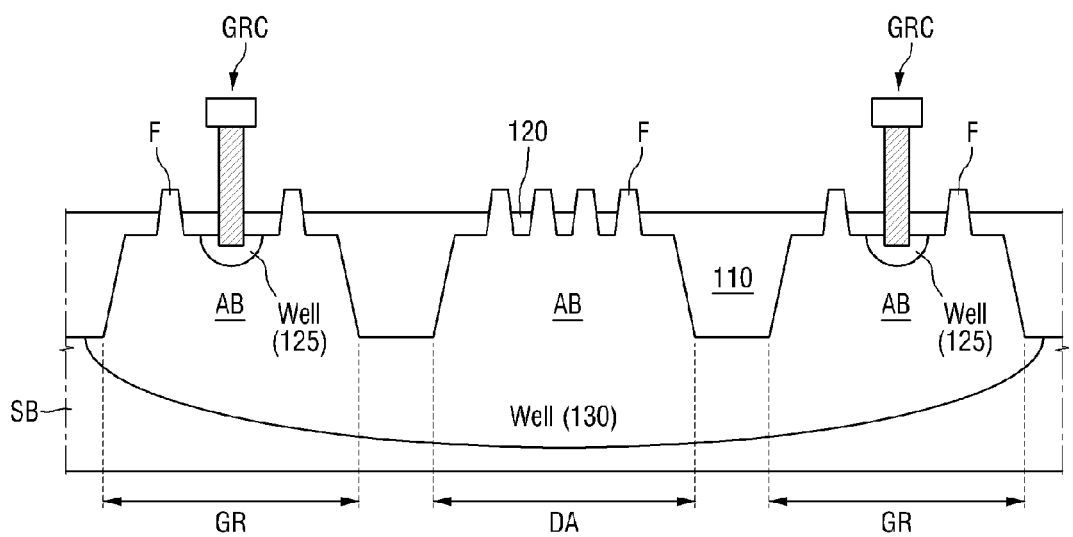

Referring to FIGS. 19A and 19B, the semiconductor device 10 according to the present embodiment may include a device region DA and a guard ring GR.

At least one of the semiconductor devices 1 to 9 according to the above-described embodiments may be formed on the device region DA. That is to say, active fins F formed on the device region DA may be used in forming working transistors.

The guard ring GR may be disposed to surround the device region DA. As shown, the guard ring GR may be connected to a ground contact GRC through a contact well 125.

As shown, each of the device region DA and the guard ring GR may include active bases AB and active fins F formed on the active bases AB. Here, the active bases AB may be separated from each other by a deep trench isolation (DTI) 110 and the active fins F may be separated from each other by a shallow trench isolation (STI) 120. For the sake of convenient explanation, in FIG. 19B, only one of the active bases AB is formed on the device region DA, but aspects of the example embodiments are not limited thereto. In some other embodiments, a plurality of active bases AB may be formed on the device region DA.

As shown, the device region DA and the guard ring GR may be separated from each other by the deep trench isolation (DTI) 110. Meanwhile, the active fins F of the device region DA and the guard ring GR may be disposed in the same well 130. Accordingly, the active fins F of the semiconductor devices 1 to 9 according to the above-described embodiments may be connected to a ground voltage through the guard ring GR. In some embodiments, the well 130 may be, for example, a P− type well and the contact well 125 may be a P+ type well, but aspects of the example embodiments are not limited thereto.

Next, a semiconductor device according to an eleventh embodiment will be described with reference to FIGS. 20A and 20B.

Figure 20A:
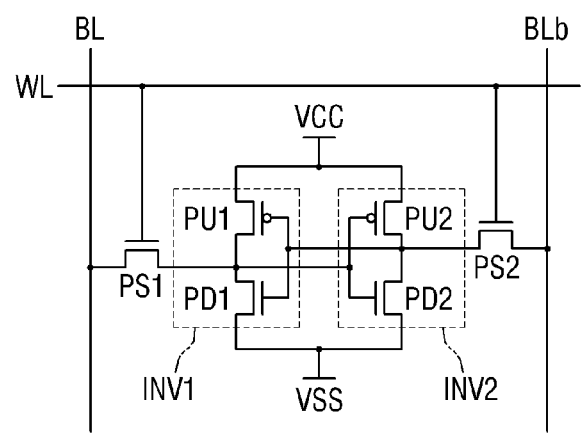
FIG. 20A is a circuit view of a semiconductor device according to an eleventh embodiment and FIG. 20B is a layout view of the semiconductor device shown in FIG. 20A.
Figure 20B:
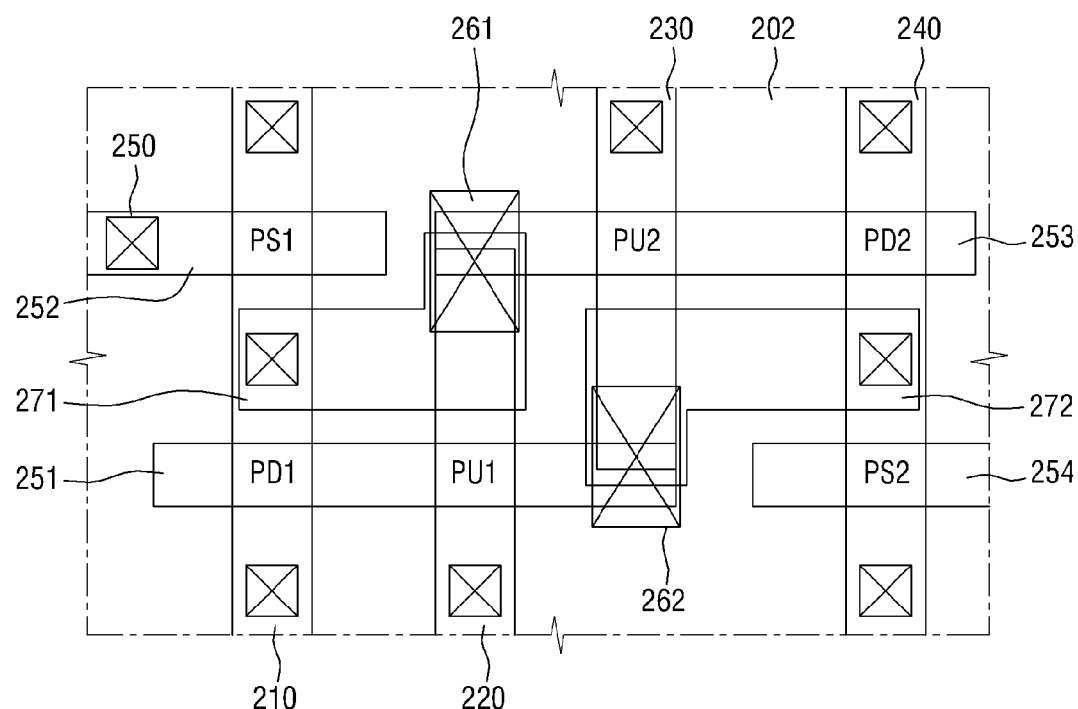

FIG. 20A is a circuit view of a semiconductor device according to an eleventh embodiment and FIG. 20B is a layout view of the semiconductor device shown in FIG. 20A. The following description will focus on differences between the present embodiment and the previous embodiments.

Referring to FIGS. 20A and 20B, the semiconductor device 11 may include a pair of inverters INV1 and INV2 connected in parallel between a power supply node Vcc and a ground node Vss, and a first pass transistor PS1 and a second pass transistor PS2 connected to output nodes of the inverters INV1 and INV2. The first pass transistor PS1 and the second pass transistor PS2 may be connected to a bit line BL and a complementary bit line BLb. Gates of the first pass transistor PS1 and the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PFET transistors, and the first pull-down transistor PD1 and the second pull-down transistor PD2 may be NFET transistors.

In addition, in order to constitute a latch circuit, an input node of the first inverter INV1 is connected to an output node of the second inverter INV2 and an input node of the second inverter INV2 is connected to an output node of the first inverter INV1.

Referring to FIGS. 20A and 20B, a first active fin 210, a second active fin 220, a third active fin 230 and a fourth active fin 240, which are spaced apart from one another, may extend lengthwise in a direction (e.g., in an up-and-down direction of FIG. 20B). The second active fin 220 and the third active fin 230 may extend in smaller lengths than the first active fin 210 and the fourth active fin 240.

In addition, a first gate electrode 251, a second gate electrode 252, a third gate electrode 253, and a fourth gate electrode 254 are formed to extend in the other direction (for example, in a left-and-right direction of FIG. 20B) to intersect the first active fin 210 to the fourth active fin 240. In detail, the first gate electrode 251 completely intersects the first active fin 210 and the second active fin 220 while partially overlapping with a terminal of the third active fin 230. The third gate electrode 253 completely intersects the fourth active fin 240 and the third active fin 230 while partially overlapping with a terminal of the second active fin 220. The second gate electrode 252 and the fourth gate electrode 254 are formed to intersect the first active fin 210 and the fourth active fin 240, respectively.

As shown, the first pull-up transistor PU1 is defined in vicinity of an intersection of the first gate electrode 251 and the second active fin 220, the first pull-down transistor PD1 is defined in vicinity of an intersection of the first gate electrode 251 and the first fin F1, and the first pass transistor PS1 is defined in vicinity of an intersection of the second gate electrode 252 and the first active fin 210. The second pull-up transistor PU2 is defined in vicinity of an intersection of the third gate electrode 253 and the third active fin 230, the second pull-down transistor PD2 is defined in vicinity of an intersection of the third gate electrode 253 and the fourth active fin 240, and the second pass transistor PS2 is defined in vicinity of an intersection of the fourth gate electrode 254 and the fourth active fin 240.

Although not specifically shown, sources/drains may be formed at opposite sides of the respective intersections of the first to fourth gate electrodes 251-254 and the first to fourth active fins 210, 220, 230 and 240, and a plurality of contacts 250 may be formed.

A shared contact 261 concurrently connects the second active fin 220, a third gate line 253 and a wire 271. The shared contact 361 may also concurrently connect the third active fin 230, a first gate line 251 and a wire 272.

At least one of the transistors included in the semiconductor devices 1 to 10 according to the above-described embodiments may be employed to at least one of six transistors shown in FIGS. 20A and 20B. For example, a bit line signal may be input to the first and second pass transistors PS1 and PS2, and a power supply voltage may be input to the first and second pull-up transistors PU1 and PU2 through a power supply node VCC. Therefore, if the transistors included in the semiconductor devices 1 to 10 according to the above-described embodiments are employed as the illustrated transistors, the semiconductor devices enabling an electrostatic discharge (ESD) operation and having improved reliability can be achieved.

Next, a semiconductor device according to a twelfth embodiment will be described with reference to FIGS. 21 to 23.

Figure 21:
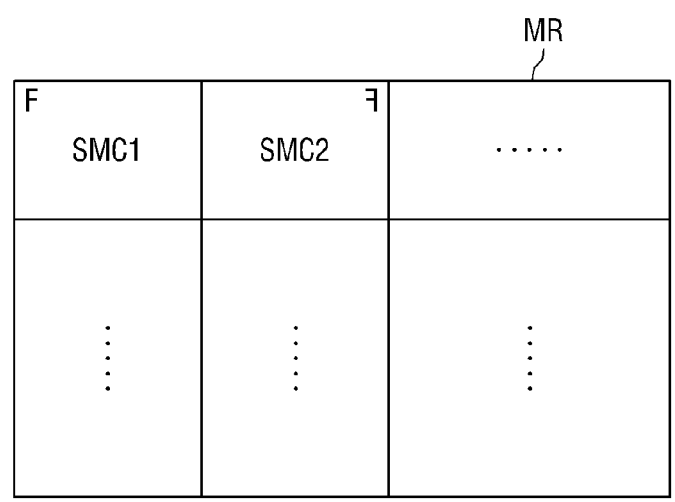
FIG. 21 is a conceptual layout view of a semiconductor device according to a twelfth embodiment.
Figure 22:
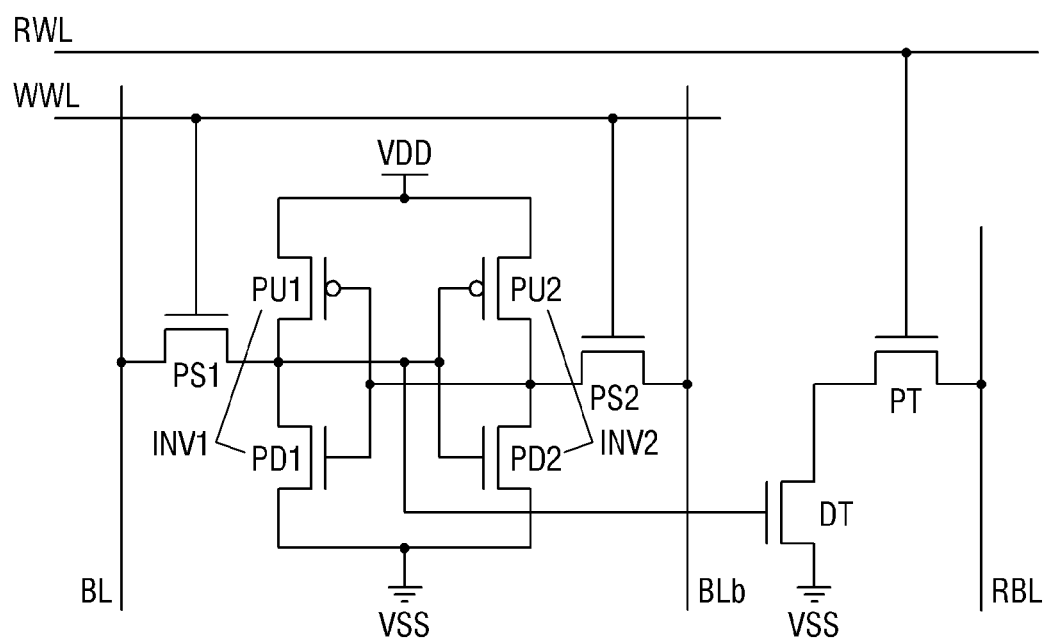
FIG. 22 is a circuit view of a first SRAM memory cell of FIG. 21.
Figure 23:
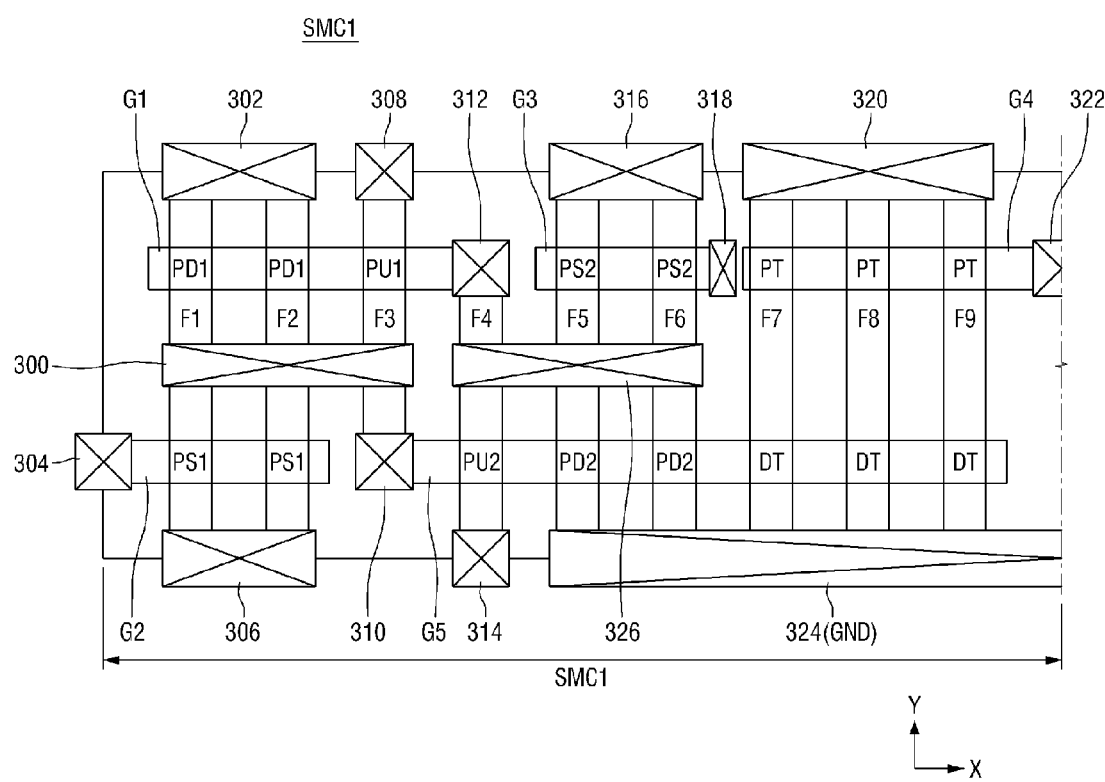
FIG. 23 is a layout view of the first SRAM memory cell of FIG. 21.

FIG. 21 is a conceptual layout view of a semiconductor device according to a twelfth embodiment, FIG. 22 is a circuit view of a first SRAM memory cell of FIG. 21 and FIG. 23 is a layout view of the first SRAM memory cell of FIG. 21. The following description will focus on differences between the present embodiment and the previous embodiments.

In the following description, the example embodiments will be described with regard to a case where an SRAM device is formed in each memory cell array region MR, but aspects of the example embodiments are not limited thereto. In addition, in the following description, the example embodiments will be described with regard to a case where an 8T SRAM device including 8 transistors is formed in each memory cell array region MR, but aspects of the example embodiments are not limited thereto.

First, referring to FIG. 21, a plurality of SRAM memory cell regions SMC1 and SMC2 may be disposed on a memory cell array region MR of the semiconductor device 12. As shown in FIG. 21, the plurality of SRAM memory cell regions SMC1 and SMC2 may be aligned and disposed in a matrix configuration to have an array configuration.

Next, referring to FIG. 22, each of the plurality of SRAM memory cell regions SMC1 and SMC2 may include inverters INV1 and INV2 connected in parallel between a power supply node VDD and a ground node VSS, a first select transistor PS1 and a second select transistor PS2 connected to output nodes of the inverters INV1 and INV2, a drive transistor DT controlled by the output of the first inverter INV1, and a pass transistor PT connected to an output node of the drive transistor DT. That is to say, in the embodiment, each of the SRAM memory cell regions (e.g., first SRAM memory cell region SMC1) may include an SRAM device including 8 transistors.

The first select transistor PS1 and the second select transistor PS2 may be connected to a bit line BL and a complementary bit line BLb. Gates of the first pass transistor PS1 and the second pass transistor PS2 may be connected to a write word line WWL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PFET transistors, and the first pull-down transistor PD1 and the second pull-down transistor PD2 may be NFET transistors.

In addition, in order to constitute a latch circuit, an input node of the first inverter INV1 is connected to an output node of the second inverter INV2, and an input node of the second inverter INV2 is connected to an output node of the first inverter INV1.

The drive transistor DT and the pass transistor PT may be used to read data stored in the latch circuit including the first inverter INV1 and the second inverter INV2. A gate of the drive transistor DT may be connected to an output node of the first inverter INV1 and a gate of the pass transistor PT may be connected to a read word line RWL. As shown, the output of the drive transistor DT may be connected to the ground node VSS and the output of the pass transistor PT may be connected to a read bit line RBL.

With the circuit configuration, in the semiconductor device 12 according to the present embodiment, data stored in the SRAM device can be accessed through two ports (e.g., double ports). First, the write word line WWL, the bit line BL and the complementary bit line BLb are selected to write data to the latch circuit including the first inverter INV1 and the second inverter INV2, or to read the data stored in the latch circuit. That is to say, the path formed by the write word line WWL, the bit line BL and the complementary bit line BLb may be used as a first port. In addition, the read word line RWL and the read bit line RBL are selected to read data stored in the latch circuit including the first inverter INV1 and the second inverter INV2. That is to say, the path formed by the read word line RWL and the read bit line RBL may be used as a second port.

In the aforementioned SRAM device, since operations of the second port and the first port are independently performed, the data stored in the latch circuit may not be affected. In other words, the operation of reading the data stored in the latch circuit and the operation of writing the data to the latch circuit may be independently performed.

Next, referring to FIG. 23, each of the SRAM memory cell regions (e.g., first SRAM memory cell region SMC1) may include 9 active fins F1 to F9, 5 gate electrodes G1 to G5, and a plurality of contacts 300, 302, 304, 306, 308, 310, 312, 314, 316, 318, 320, 322, 324 and 326.

The first to ninth active fins F1 to F9 may be disposed to extend in the second direction (e.g., in the Y-axis direction).

The first gate electrode G1 may overlap with the first to third active fins F1 to F3 and may extend in a first direction (e.g., in the X-axis direction). The first pull-down transistor PD1 may be formed at intersections of the first and second active fins F1 and F2 and the first gate electrode G1, and the first pull-up transistor PU1 may be formed at an intersection of the third active fin F3 and the first gate electrode G1.

A source of the first pull-down transistor PD1 may be connected to the second contact 302. Here, the second contact 302 may be connected to the ground node VSS. A source of the first pull-up transistor PU1 may be connected to the fifth contact 308. Here, the fifth contact 308 may be connected to the power supply node VDD. A drain of the first pull-down transistor PD1 and a drain of the first pull-up transistor PU1 may be connected to the first contact 300. That is to say, the first pull-down transistor PD1 and the first pull-up transistor PU1 may share the first contact 300.

Meanwhile, the first select transistor PS1 may be formed at intersections of the first and second active fins F1 and F2 and the second gate electrode G2. A drain of the first select transistor PS1 may be connected to the first contact 300. That is to say, the first pull-down transistor PD1, the first pull-up transistor PU1, and the first select transistor PS1 may share the first contact 300. A source of the first select transistor PS1 may be connected to the fourth contact 306. In addition, the fourth contact 306 may be connected to the bit line BL. Meanwhile, the second gate electrode G2 may be connected to the third contact 304. The third contact 304 may be connected to the write word line WWL.

Here, the first pull-down transistor PD1 and the first select transistor PS1 may be formed by two active fins F1 and F2, and the first pull-up transistor PU1 may be formed by one active fin F3. Therefore, the first pull-down transistor PD1 and the first select transistor PS1 may be larger than the first pull-up transistor PU1 in size.

The sixth contact 310 may be connected to the first contact 300 through the third active fin F3. The sixth contact 310 may be connected to the fifth gate electrode G5. The fifth gate electrode G5 may extend in the first direction (e.g., in the X-axis direction) to cross the fourth to ninth active fins F4 to F9.

The second pull-up transistor PU2 may be formed at an intersection of the fourth active fin F4 and the fifth gate electrode G5, the second pull-down transistor PD2 may be formed at intersections of the fifth and sixth active fins F5 and F6 and the fifth gate electrode G5, and the drive transistor DT may be formed at intersections of the seventh to ninth active fins F7 to F9 and the fifth gate electrode G5.

As described above, since the first contact 300 is connected to the fifth gate electrode G5 through the third active fin F3 and the sixth contact 310, outputs of the first pull-up transistor PU1, the first pull-down transistor PD1 and the first select transistor PS1 may be applied to gates of the second pull-up transistor PU2, the second pull-down transistor PD2 and the drive transistor DT.

A drain of the second pull-up transistor PU2 and a drain of the second pull-down transistor PD2 may be connected to the seventh contact 312 and the fourteenth contact 326, respectively. In addition, the seventh contact 312 may be connected to the first gate electrode G1. Therefore, the output of the second pull-up transistor PU2 and the output of the second pull-down transistor PD2 may be applied to gates of the first pull-up transistor PU1 and the first pull-down transistor PD1.

A source of the second pull-up transistor PU2 may be connected to the eighth contact 314. In addition, the eighth contact 314 may be connected to the power supply node VDD. A source of the second pull-down transistor PD2 and a source of the drive transistor DT may be connected to the thirteenth contact 324. In addition, the thirteenth contact 324 may be connected to the ground node VSS.

The second select transistor PS2 may be formed at intersections of the fifth and sixth active fins F5 and F6 and the third gate electrode G3, and the pass transistor PT may be formed at intersections of the seventh to ninth active fins F7 to F9 and the fourth gate electrode G4.

A source of the second select transistor PS2 may be connected to the ninth contact 316. The ninth contact 316 may be connected to the complementary bit line BLb. A drain of the second select transistor PS2 may be connected to the fourteenth contact 326. As described above, the fourteenth contact 326 is connected to the seventh contact 312 through the fourth active fin F4, the output of the second select transistor PS2 may be applied to gates of the first pull-up transistor PU1 and the first pull-down transistor PD1. Meanwhile, as shown, the third gate electrode G3 may be connected to the tenth contact 318. The tenth contact 318 may be connected to the write word line WWL. In other words, the tenth contact 318 and the fourth contact 306 may be electrically connected to each other.

A source of the pass transistor PT may be connected to the eleventh contact 320. The eleventh contact 320 may be connected to the read bit line RBL. A drain of the pass transistor PT may be connected to a drain of the drive transistor DT.

The fourth gate electrode G4 may be connected to the twelfth contact 322. The twelfth contact 322 may be connected to the read word line RWL. In the present embodiment, the first SRAM memory cell region SMC1 and the second SRAM memory cell region SMC2 may share the twelfth contact 322 and the thirteenth contact 324, but aspects of the example embodiments are not limited thereto. For example, in some other embodiments, the first SRAM memory cell region SMC1 and the second SRAM memory cell region SMC2 may not share a contact but may be connected to the read word line RWL and the ground node VSS through separate contacts, respectively.

Meanwhile, the drive transistor DT and the pass transistor PT are formed by three active fins F7 to F9, the second pull-down transistor PD2 and the second select transistor PS2 are formed by two active fins F5 and F6, and the second pull-up transistor PU2 is formed by one active fin F4. Therefore, the drive transistor DT and the pass transistor PT may be larger than the second pull-down transistor PD2 and the second select transistor PS2 in size, and the second pull-down transistor PD2 and the second select transistor PS2 may be larger than the second pull-up transistor PU2 in size. In other words, in the present embodiment, the size of a transistor formed at a boundary between the first SRAM memory cell region SMC1 and the second SRAM memory cell region SMC2 may be larger than the size of a transistor located far from the boundary between the first SRAM memory cell region SMC1 and the second SRAM memory cell region SMC2.

At least one of transistors included in the semiconductor devices 1 to 10 according to the above-described embodiments may be employed to at least one of six transistors shown in FIGS. 22 to 23.

Next, a semiconductor device according to thirteenth and fourteenth embodiments will be described with reference to FIGS. 24 and 25.

Figure 24:
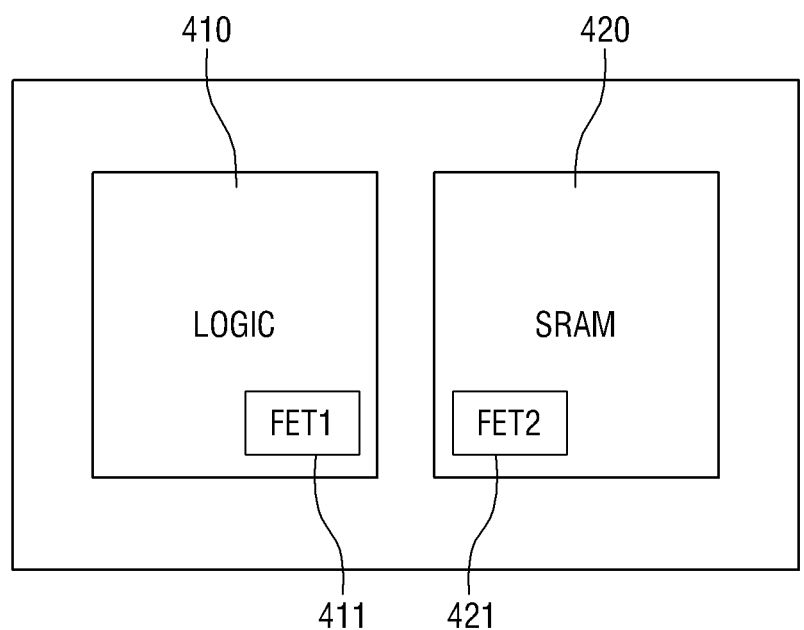
FIG. 24 illustrates a semiconductor device according to a thirteenth embodiment.
Figure 25:
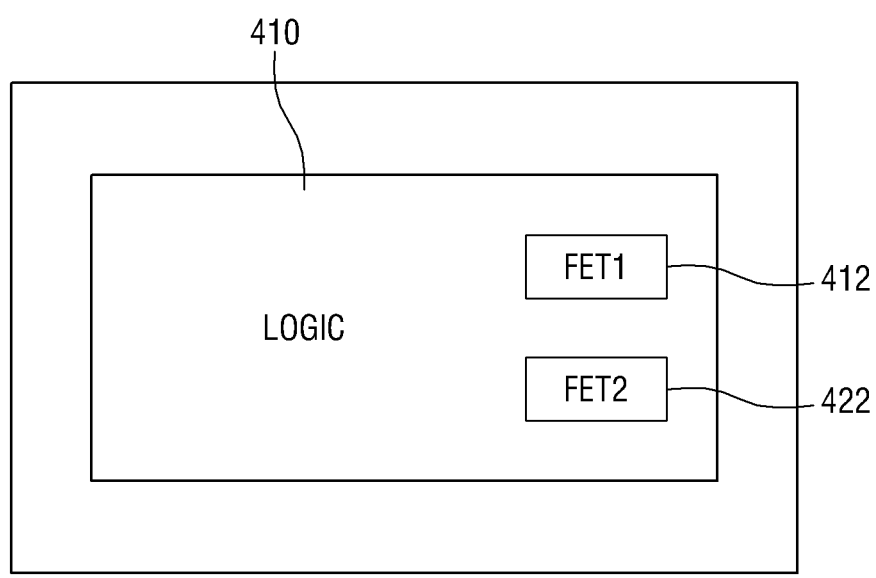
FIG. 25 illustrates a semiconductor device according to a fourteenth embodiment.

FIG. 24 illustrates a semiconductor device according to a thirteenth embodiment and FIG. 25 illustrates a semiconductor device according to a fourteenth embodiment. The following description will focus on differences between the present embodiment and the previous embodiments.

First, referring to FIG. 24, the semiconductor device 13 according to the thirteenth embodiment may include a logic region 410 and an SRAM forming region 420. A first transistor 411 may be disposed on the logic region 410 and a second transistor 421 may be disposed on the SRAM forming region 420.

Next, referring to FIG. 25, the semiconductor device 14 according to the fourteenth embodiment may include a logic region 410, and third and fourth transistors 412 and 422 different from each other may be disposed in the logic region 410. Meanwhile, although not separately shown, third and fourth transistors 412 and 422 different from each other may also be disposed in an SRAM forming region.

Here, the first transistor 411 may be one of the semiconductor devices 1 to 10 according to the above-described embodiments, and the second transistor 421 may be another one of the semiconductor devices 1 to 12 according to the above-described embodiments. For example, the first transistor 411 may be the semiconductor device 1 shown in FIG. 1, and the second transistor 421 may be the semiconductor device 12 shown in FIG. 22.

Meanwhile, the third transistor 412 may be one of the semiconductor devices 1 to 10 according to the above-described embodiments, and the fourth transistor 422 may be another one of the semiconductor devices 1 to 10 according to the above-described embodiments.

Figure 26:
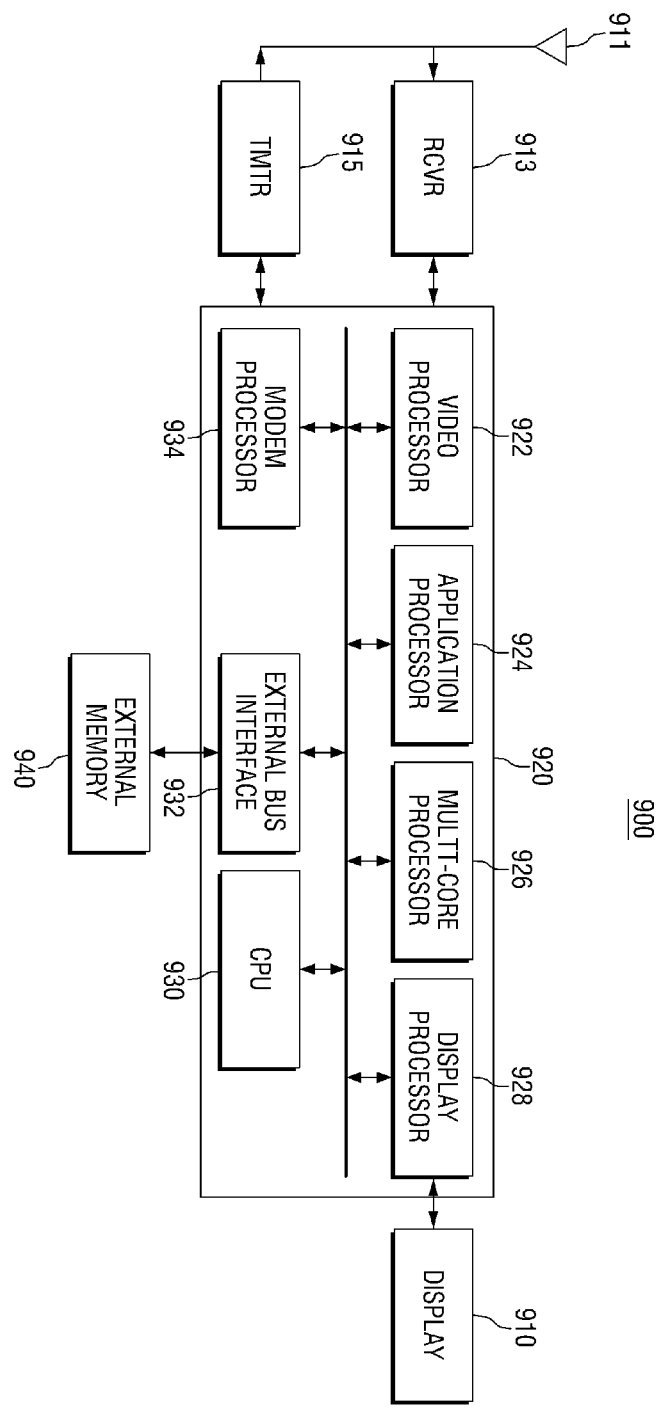
FIG. 26 is a block diagram of a wireless communication device including a semiconductor device according to an example embodiments.

In FIG. 24, the logic region 410 and the SRAM forming region 420 are exemplified, but aspects of the example embodiments are not limited thereto. For example, the example embodiments may also be applied to the logic region 410 and regions for forming other types of memories (e.g., DRAM, MRAM, RRAM, PRAM, etc.). FIG. 26 is a block diagram of a wireless communication device including a semiconductor device according to embodiments.

Referring to FIG. 26, the wireless communication device 900 may be a cellular phone, a smart phone, a handset, a personal digital assistant (PDA), a laptop computer, a video game unit or other types of devices. the wireless communication device 900 may adopt code division multiple access (CDMA), time division multiple access (TDMA) such as a global system for mobile communications (GSM), or other types of wireless communication standards.

The wireless communication device 900 may provide bi-directional communication through a reception path and a transmission path. On the reception path, signals transmitted by one or more base stations may be received by an antenna 911 or may be provided to a receiver (RCVR) 913. The receiver 913 may condition and digitalize the received signals and may provide samples to a digital section 920 for further processing. On the transmission path, a transmitter (TMTR) 915 may receive the data transmitted from the digital section 920, may process and condition the data and may generate modulated signals to be transmitted to one or more base stations through the antenna 911.

The digital section 920 may be implemented by one or more digital signal processors (DSPs), a micro-processor, or a reduced instruction set computer (RISC). The digital section 920 may be fabricated on one or more application specific integrated circuits (ASICs) or other types of ICs.

The digital section 920 may include, for example, various processing and interface units, such as a modem processor (934, a video processor 922, an application processor 924, a display processor 928, a controller/multi-core processor 926, a central processing unit 930, and an external bus interface (EBI) 932.

The video processor 922 may perform processing on graphic applications. In general, the video processor 922 may include an arbitrary number of processing units or modules for an arbitrary set of graphic operations. Particular parts of the video processor 922 may be implemented by firmware and/or software. For example, a controller may be implemented by firmware and/or software modules for performing the above-described functions (e.g., procedures, functions, etc.). Firmware and/or software codes may be stored in a memory or may be executed by a processor (e.g., the multi-core processor 926). The memory may be implemented inside or outside the processor.

The video processor 922 may implement software interface such as open graphic library (OpenGL) or Direct3D. The central processing unit 930 may perform a series of graphic processing operations with the video processor 922. The controller/multi-core processor 926, including at least two cores, may allocate workloads to the at least two cores according to the workload to be processed by the controller/multi-core processor 926 and may simultaneously process the corresponding workloads.

In the illustrated embodiment, the application processor 924 is exemplified as a component of the digital section 920, but aspects of the example embodiments are not limited thereto. In some embodiments, the digital section 920 may be incorporated into one application processor 924 or an application chip.

The modem processor 934 may perform operations required during data transmission between the receiver 913, the transmitter 915 and the digital section 920. The display processor 928 may perform operations required to drive the display 910.

The semiconductor devices 1 to 14 according to the above-described embodiments may be used as cache memories or buffer memories used in performing operations of the processors 922, 924, 926, 928, 930 and 934.

Next, a computing system including a semiconductor device according to some embodiments will be described with reference to FIG. 27.

Figure 27:
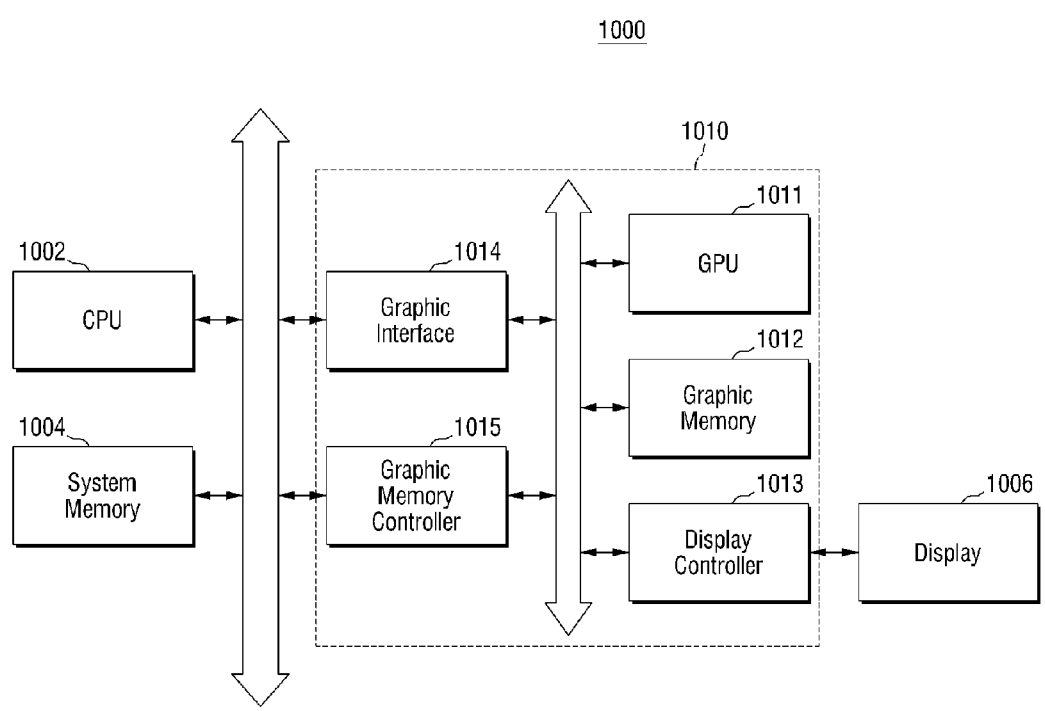
FIG. 27 is a block diagram of a computing system including a semiconductor device according to an example embodiment.

FIG. 27 is a block diagram of a computing system including a semiconductor device according to embodiments.

Referring to FIG. 27, the computing system 1000 may include a central processing unit (CPU) 1002, a system memory 1004, a graphic system 1010, and a display 1006.

The CPU 1002 may perform operations required to drive the computing system 1000. The system memory 1004 may be configured to store data. The system memory 1004 may store data processed by the CPU 1002. The system memory 1004 may function as a working memory of the CPU 1002. The system memory 1004 may include one or more volatile memory devices, such as a double data rate static dynamic random access memory (DDR SDRAM), or a single data rate static dynamic random access memory (SDR SDRAM), and/or one or more nonvolatile memory devices, such as an electrical erasable programmable ROM (EEPROM) or a flash memory.

One of the semiconductor devices 1 to 14 according to the above-described embodiments may be employed as a component of the system memory 1004.

The graphic system 1010 may include a graphic processing unit (GPU) 1011, a graphic memory 1012, a display controller 1013, a graphic interface 1014, and a graphic memory controller 1015.

The GPU 1011 may perform graphic operations required for the computing system 1000. In detail, the GPU 1011 may assemble primitives including one or more vertexes and may perform rendering using the assembled primitives.

The graphic memory 1012 may store graphic data processed by the GPU 1011 or may store data provided to the GPU 1011. Alternatively, the graphic memory 1012 may function as a working memory of the GPU 1011. One of the semiconductor devices 1 to 6 according to the above-described embodiments may be employed as a component of the graphic memory 1012.

The display controller 1013 may control the display 1006 to display a rendered image frame.

The graphic interface 1014 may interface between the CPU 1002 and the GPU 1011, and the graphic memory controller 1015 may provide memory access between the system memory 1004 and the GPU 1011.

Although not shown in FIG. 27, the computing system 1000 may include at least one input device, such as buttons, a touch screen, a microphone, and so on, and/or at least one output device, such as a speaker and so on. The computing system 1000 may further include an interface device for exchanging data with an external device in a wired or wireless manner. The interface device may include an antenna or a wired/wireless transceiver, and so on.

According to embodiments, the computing system 1000 may be an arbitrary computing system, such as a mobile phone, a smart phone, a personal digital assistant (PDA), a desktop computer, a notebook computer, a tablet PC, and so on.

Next, an electronic system including a semiconductor device according to embodiments will be described with reference to FIG. 28.

Figure 28:
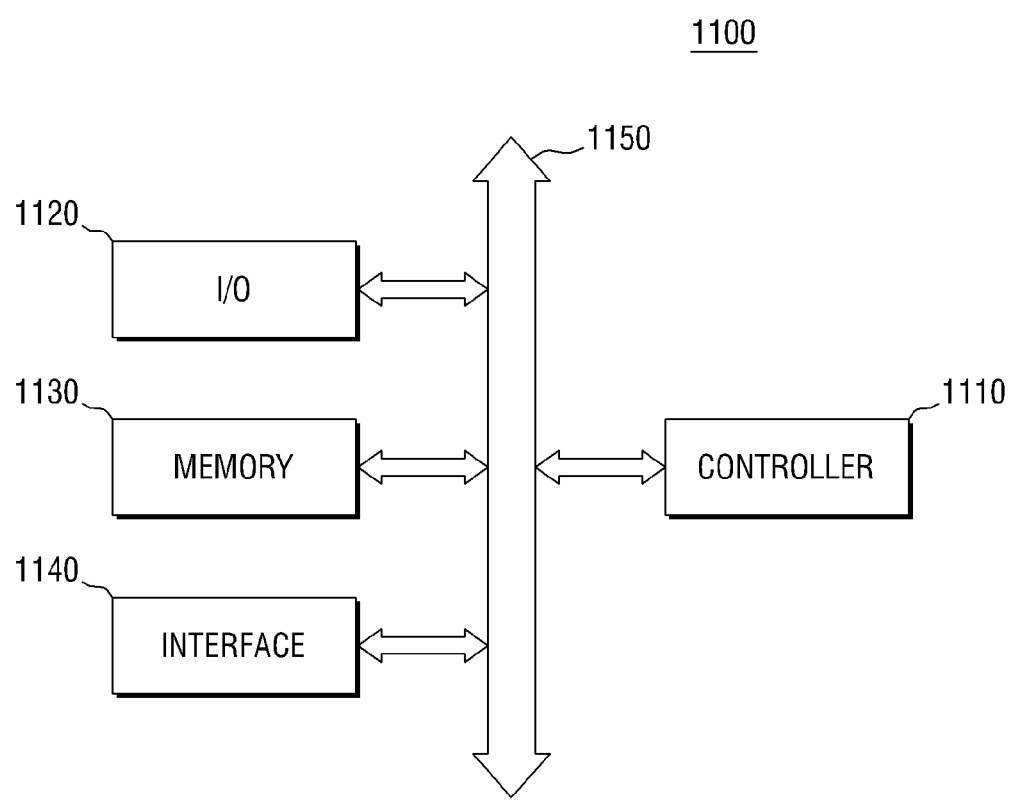
FIG. 28 is a block diagram of an electronic system including a semiconductor device according to an example embodiment.

FIG. 28 is a block diagram of an electronic system including a semiconductor device according to embodiments.

Referring to FIG. 28, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network or receiving data from the communication network.

The interface 1140 may be wired or wireless. For example, the interface 1140 may include an antenna or a wired/wireless transceiver, and so on.

Although not shown, the electronic system 1100 may further include high-speed DRAM and/or SRAM as the working memory for improving the operation of the controller 1110. Here, as the working memory, one of the semiconductor devices 1 to 6 according to some embodiments may be employed. In addition, one of the semiconductor devices 1 to 14 according to some embodiments may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 29:
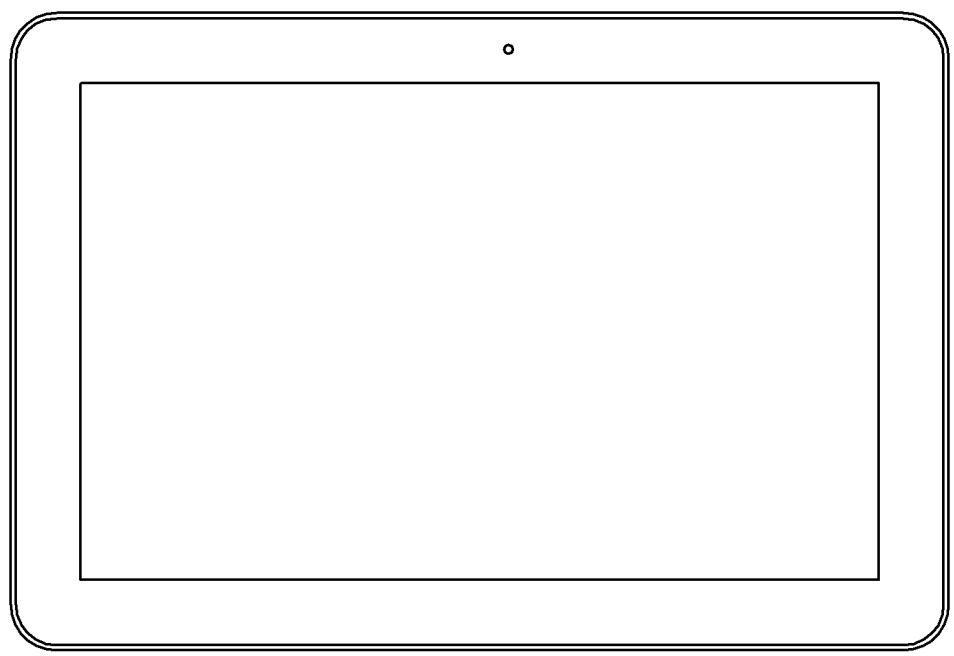
FIGS. 29 to 31 illustrate exemplary semiconductor systems to which a semiconductor device according to some embodiments can be applied.
Figure 30:
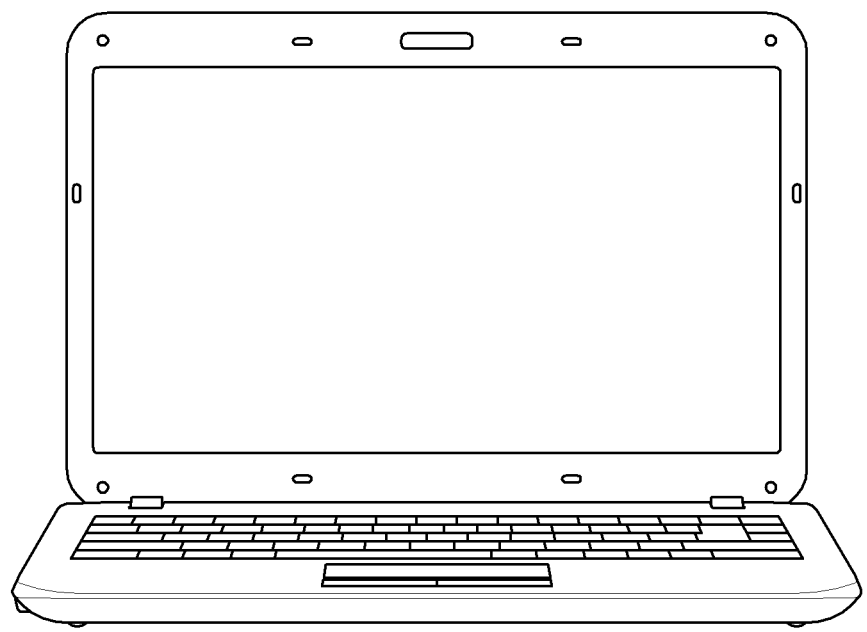
Figure 31:
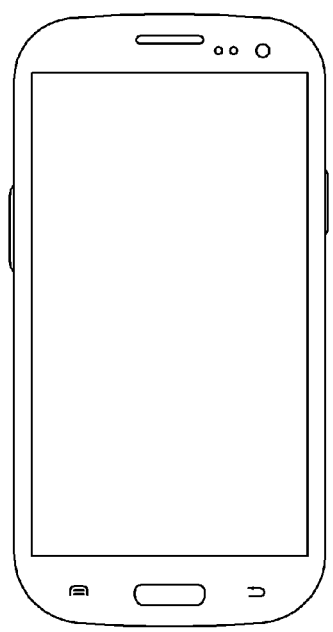

FIGS. 29 to 31 illustrate exemplary semiconductor systems to which a semiconductor device according to some embodiments can be applied.

FIG. 29 illustrates an example in which a semiconductor device according to an embodiment is applied to a tablet PC 1200, FIG. 30 illustrates an example in which a semiconductor device according to an embodiment is applied to a notebook computer 1300, and FIG. 31 illustrates an example in which a semiconductor device according to an embodiment is applied to a smart phone 1400. At least one of the semiconductor devices 1 to 14 according to some embodiments can be employed to a tablet PC, a notebook computer, a smart phone, and the like.

It is obvious to one skilled in the art that the semiconductor devices according to some embodiments may also be applied to other IC devices not illustrated herein.

That is to say, in the illustrated embodiment, only the tablet PC 1200, the notebook computer 1300, and the smart phone 1400 are exemplified as the semiconductor system according to the present embodiment, but not limited thereto.

In some embodiments, the semiconductor system may be implemented as a computer, an ultra mobile personal computer (UMPC), a work station, a net-book, a personal digital assistant (PDA), a portable computer, a wireless phone, a mobile phone, an e-book, a portable multimedia player (PMP), a portable game console, a navigation device, a black box, a digital camera, a 3-dimensional television, a digital audio recorder, a digital audio player, a digital picture recorder, a digital picture player, digital video recorder, a digital video player, and so on.

Next, a method for fabricating a semiconductor device according to some embodiments will be described with reference to FIGS. 32 to 34.

Figure 32:
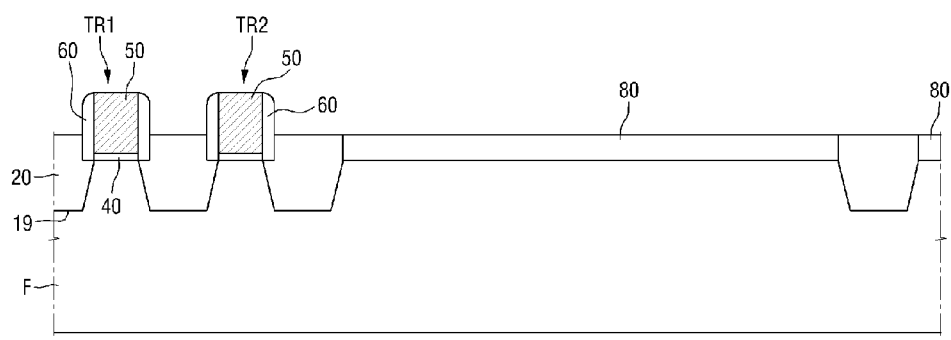
FIGS. 32 to 34B illustrate intermediate process steps in a method for fabricating a semiconductor device according to some embodiments.
Figure 33:
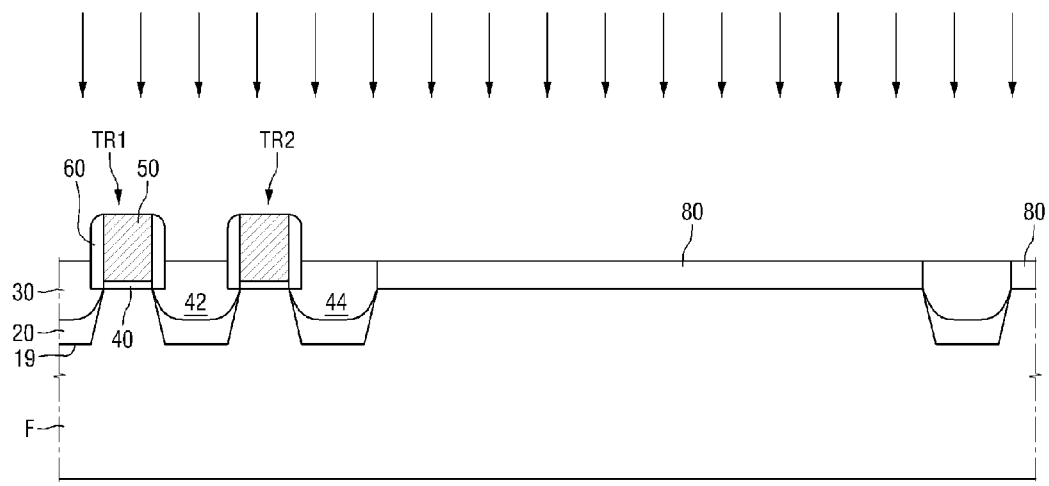

FIGS. 32 to 34 illustrate intermediate process steps in a method for fabricating a semiconductor device according to some embodiments.

First, referring to FIG. 32, a gate insulation layer 40 and gate electrodes 50 are sequentially formed on active fins F. Next, an etch stop layer 80 is formed at one side of the gate electrode 50 of the second transistor TR2, where an extended impurity region is to be formed. In some embodiments, a spacer 60 on both sides of the gate electrodes 50 may be simultaneously formed with the etch stop layer 80. Therefore, when the spacer 60 is formed of, for example, a nitride layer, the etch stop layer 80 may also be formed of a nitride layer.

Next, trenches 19 are formed by etching the active fins F using the formed spacers 60, the gate electrode 50 and the etch stop layer 80 as masks. Accordingly, as shown in FIG. 32, the trench 19 may be formed in the vicinity of the gate electrodes 50 or in the vicinity of the etch stop layer 80.

Next, the epitaxial layer 20 is formed in the trenches 19 using, for example, an epitaxial growth process. Thus, the epitaxial layer 20 may fill the inside of the trench 19 and may be formed for a sufficiently long time. Here, a top surface of the epitaxial layer 20 becomes higher than a bottom surface of the gate electrodes 50. Meanwhile, the epitaxial layer 20 may not be formed at regions where the spacers 60, the gate electrodes 50 and the etch stop layer 80 are formed.

Next, referring to FIG. 33, an impurity diffusion process is performed on the active fins F using the gate electrodes 50 and the etch stop layer 80 as masks. In some embodiments, the impurity diffusion process may include a first diffusion process shown in FIG. 33 and a second diffusion process shown in FIG. 34.

First, impurity is diffused into the epitaxial layer 20 through the first diffusion process shown in FIG. 33. Here, the impurity is not diffused into the active fins F having the etch stop layer 80. In some embodiments, the first diffusion process may include an ion implantation process of implanting ions into the active fins F with first energy, but aspects of the example embodiment are not limited thereto.

Figure 34A:
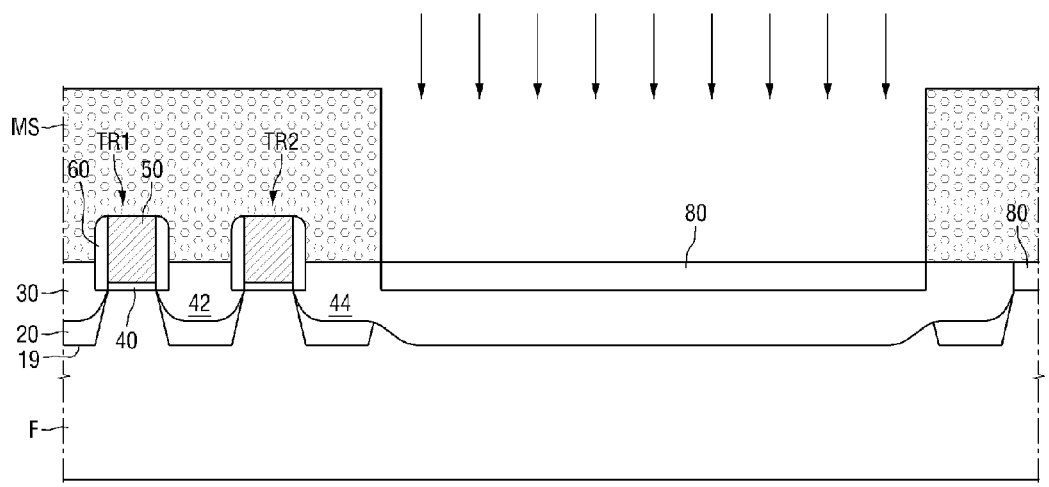

Next, referring to FIG. 34A, after a mask MS exposing the etch stop layer 80 is formed, the impurity is diffused into the active fins F through the second diffusion process. Here, the impurity may be deeply diffused into the active fins F, as shown in FIG. 34. In some embodiments, the second diffusion process may include an ion implantation process of implanting ions into the active fins F with second energy greater than the first energy used in the first diffusion process, but aspects of the example embodiment are not limited thereto.

Figure 34B:
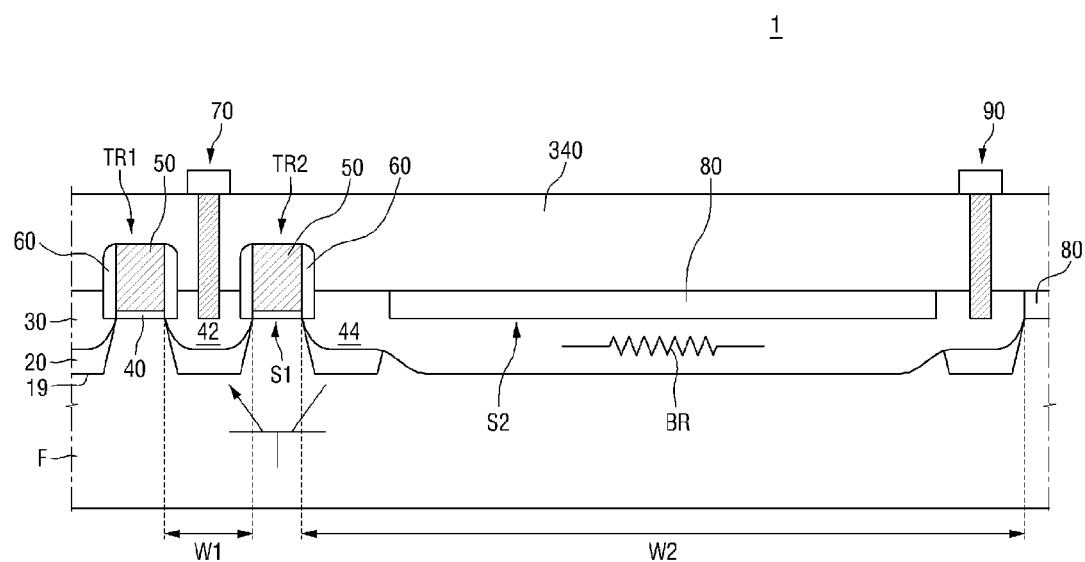

Thereafter, as shown in FIG. 34B, the mask MS is removed, and an inter-layer dielectric layer (ILD) 340 is formed. The ILD 340 is etched to form contact holes exposing the first impurity region 42 and the distal end of the second impurity region 44. Contacts (or contact plugs) 70 and 90 are respectively formed in the contact holes and electrically connected to the first and second impurity regions 42 and 44, respectively. Thus, the semiconductor device 1 shown in FIG. 2A is fabricated. It will be appreciated that FIG. 2A and other figures of the example embodiments do not show the ILD layer simply for ease of description. Meanwhile, the semiconductor device 2 shown in FIG. 6 may be fabricated by removing the etch stop layer 80 after the process shown in FIG. 34A and before the process of FIG. 34B.

Next, a method for fabricating a semiconductor device according to some other embodiments will be described with reference to FIGS. 35A-35B.

Figure 35A:
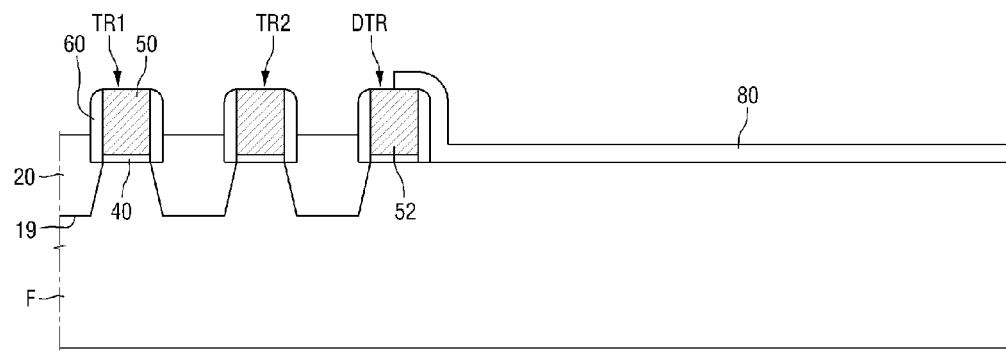
FIGS. 35A-35B illustrates process steps in a method for fabricating a semiconductor device according to some other embodiments.
Figure 35B:
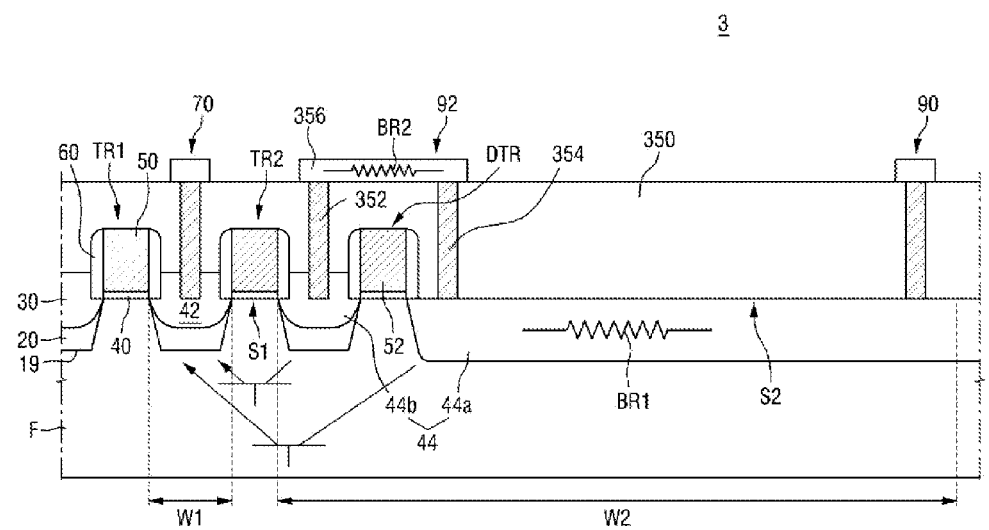

FIG. 35A illustrates intermediate process steps in a method for fabricating a semiconductor device according to some other embodiments.

Referring to FIG. 35A, in the method for fabricating the semiconductor device according to the embodiment, when gate electrodes 50 are formed on active fins F, a dummy gate electrode 52 is also formed. Next, an etch stop layer 80 is formed on the dummy gate electrode 52 and the active fin F. In detail, as shown in FIG. 35A, the etch stop layer 80 is formed such that an end of the etch stop layer 80 is disposed at the center of the dummy gate electrode 52.

Like in the previous embodiment, after trenches 19 are formed and an epitaxial layer 20 is formed in the trenches 19, and an impurity diffusion process is performed. Then, the impurity diffusion process is again performed on surfaces of the active fins F from which the etch stop layer 80 is removed. Then, impurity regions 42 and 44 shown in FIG. 8 are formed. The mask MS is removed, and an ILD 350 is formed. The ILD 350 is etched to form contact holes exposing the first impurity region 42, the second sub impurity region 44b, the first sub impurity region 44b (at a proximate end portion of the second impurity region 44) and the distal end portion of the second impurity region 44. Contacts (or contact plugs) 70, 352, 354, and 90 are respectively formed in the contact holes. Contacts 70, 352, 354 and 90 are respectively electrically connected to the first impurity region 42, the second sub impurity region 44b, the first sub impurity region 44a and the digital end portion of the second impurity region. A wire 356 is also formed on the ILD 350 electrically connecting the contacts 352 and 354. As will be appreciated, the contacts 352 and 354 and the wire 356 form the connecting wire 92. The connecting wire 92 electrically connects the first sub impurity region 44a to the second sub impurity region 44b, thereby fabricating the semiconductor device 3 shown in FIG. 8.

Next, a method for fabricating a semiconductor device according to some other embodiments will be described with reference to FIG. 36.

Figure 36:
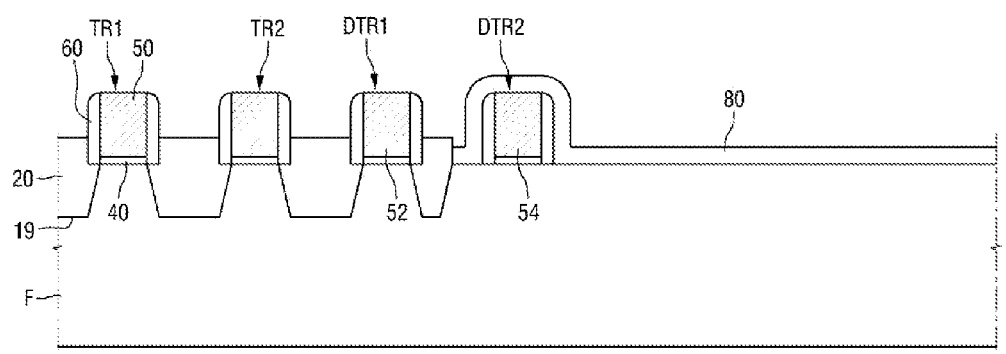
FIG. 36 illustrates intermediate process steps in a method for fabricating a semiconductor device according to some other embodiments.

FIG. 36 illustrates intermediate process steps in a method for fabricating a semiconductor device according to some other embodiments. The following description will focus on differences between the present embodiment and the previous embodiments.

Referring to FIG. 36, in the method for fabricating the semiconductor device according to the embodiment, when gate electrodes 50 are formed on active fins F, first and second dummy gate electrodes 52 and 54 are formed. Next, an etch stop layer 80 is disposed on second dummy gate electrode 54 but is not disposed on the first dummy gate electrode 52. In detail, as shown in FIG. 36, the etch stop layer 80 is formed such that an end of the etch stop layer 80 is disposed between the first dummy gate electrode 52 and the second dummy gate electrode 54.

In addition, in the same manner as in the above-described embodiments, a trench 19 is formed and an epitaxial layer 20 is formed in the trench 19, followed by performing an impurity diffusion process. Then, the impurity diffusion process is again performed on surfaces of the active fins F from which the etch stop layer 80 is removed, Then, the impurity regions 42 and 44 shown in FIG. 11 are formed. Thereafter, an ILD layer, contacts and a connecting wire electrically connecting the first sub impurity region 44a to the second sub impurity region 44b are formed, thereby fabricating the semiconductor device 3 shown in FIG. 11.

Meanwhile, as described above, if a portion of the etch stop layer 80 is damaged due to misalignment of a mask when the etch stop layer 80 is removed, the semiconductor device having the same shape as the semiconductor device 5 shown in FIG. 12 is fabricated.

Next, a method for fabricating a semiconductor device according to some other embodiments will be described with reference to FIG. 37.

Figure 37:
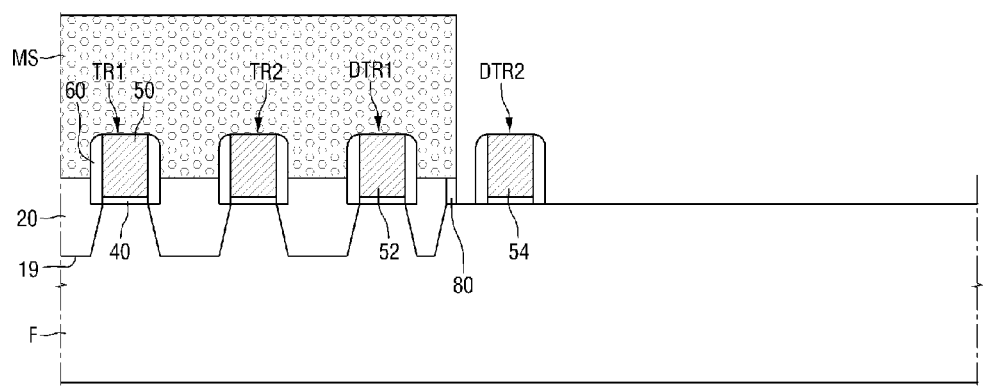
FIG. 37 illustrates intermediate process steps in a method for fabricating a semiconductor device according to some other embodiments.

FIG. 37 illustrates intermediate process steps in a method for fabricating a semiconductor device according to some other embodiments. The following description will focus on differences between the present embodiment and the previous embodiments.

As shown in FIG. 37, when the etch stop layer 80 is removed in a state in which an end of an etch stop layer (80 of FIG. 36) is disposed between the first and second dummy gate electrodes 52 and 54, a portion of the etch stop layer 80 may remain without being removed due to misalignment of a mask. The remaining etch stop layer 80 may shield the surfaces of the active fins F without being exposed, so that an impurity region shown in FIG. 13 may be formed in the active fins F having the etch stop layer 80 formed thereon. In other words, dummy impurity regions 48a and 48b separated from each other may be formed between the first dummy transistor DTR1 and the second dummy transistor DTR2.

While example embodiments has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

We claim:

1. A semiconductor device, comprising:
   at least one active fin protruding from a substrate;
   a first gate electrode crossing the active fin;
   a first impurity region formed on the active fin at a first side of the first gate electrode, at least a portion of the first impurity region being formed in a first epitaxial layer portion on the active fin; and
   a second impurity region formed on the active fin at a second side of the first gate electrode, the second impurity region having a greater width in the longitudinal direction of the active fin than the first impurity region, the second impurity region including a first portion and a second portion, the first portion being formed in a second epitaxial layer portion, and the second portion not being formed in an epitaxial layer,
   wherein the upper surfaces of the first portion and the second portion are substantially coplanar.

2. The semiconductor device of claim 1, wherein the second impurity region has a top surface at a same height as a top surface of a portion of the active fin crossed by the gate electrode.

3. The semiconductor device of claim 1, further comprising:
   a first contact electrically connected to the first impurity region; and
   a second contact electrically connected to a distal end of the second impurity region with respect to the first gate electrode.

4. The semiconductor device of claim 1, wherein a top surface of the first impurity region is higher than the top surface of the portion of the active fin crossed by the gate electrode.

5. The semiconductor device of claim 1, further comprising:
   a second gate electrode crossing the active fin;
   a third impurity region formed on the active fin at a first side of the second gate electrode; and wherein
   the first impurity region is formed on the active fin at a second side of the second gate electrode.

6. The semiconductor device of claim 1, further comprising:
   a second gate electrode crossing the active fin;
   a third impurity region formed on the active fin at a first side of the second gate electrode and the second side of the first gate electrode; and wherein
   the second impurity region is formed on the active fin at a second side of the second gate electrode.

7. The semiconductor device of claim 6, further comprising:
   a conductor electrically connecting the second and third impurity regions.

8. The semiconductor device of claim 1, wherein the first portion is at a distal end of the second impurity region with respect to the first gate electrode.

9. The semiconductor device of claim 8, further comprising:
   a first contact electrically connected to the first impurity region; and
   a second contact electrically connected to the first portion of the second impurity region.

10. The semiconductor device of claim 8, wherein a top surface of the first portion is higher than the top surface of the active fin crossed by the first gate electrode.

11. The semiconductor device of claim 10, wherein a top surface of the first impurity region is higher than the top surface of the active fin crossed by the first gate electrode.

12. The semiconductor device of claim 8, wherein the top surface of the first impurity region and the top surface of the first portion are a same height.

13. The semiconductor device of claim 8, wherein the second impurity region includes a third portion, the third portion is at a proximate end of the second impurity region with respect to the first gate electrode, and the third portion is formed in a third epitaxial layer portion on the active fin.

14. The semiconductor device of claim 13, wherein a top surface of the first portion and a top surface of the third portion are a same height.

15. The semiconductor device of claim 13, wherein a top surface of the first portion is higher than the top surface of the active fin crossed by the first gate electrode, and a top surface of the third portion is higher than the top surface of the active fin crossed by the first gate electrode.

16. The semiconductor device of claim 8, further comprising:
   an etch stop layer formed over the second portion.

17. The semiconductor device of claim 8, wherein a top surface of the first portion is a same height as a top surface of the active fin crossed by the first gate electrode.

18. The semiconductor device of claim 8, further comprising:
   a second gate electrode crossing the active fin;
   a third impurity region formed on the active fin at a first side of the second gate electrode; and wherein
   the first impurity region is formed on the active fin at a second side of the second gate electrode.

19. The semiconductor device of claim 8, further comprising:
   a second gate electrode crossing the active fin;
   a third impurity region formed on the active fin at a first side of the second gate electrode and the second side of the first gate electrode; and wherein
   the second impurity region is formed on the active fin at a second side of the second gate electrode.

20. The semiconductor device of claim 19, further comprising:
   a conductor electrically connecting the second and third impurity regions.

21. The semiconductor device of claim 1, wherein the first portion is at a proximate end of the second impurity region with respect to the first gate electrode.

22. The semiconductor device of claim 21, wherein a top surface of the first portion is higher than a top surface of the active fin crossed by the first gate electrode.

23. The semiconductor device of claim 22, wherein the top surface of the first portion and a top surface of the first impurity region have a same height.

\* \* \* \* \*